United States Patent
Taniguchi et al.

(10) Patent No.: US 9,717,151 B2
(45) Date of Patent: Jul. 25, 2017

(54) FLEX-RIGID WIRING BOARD

(71) Applicant: IBIDEN CO., LTD., Ogaki (JP)

(72) Inventors: Hirotaka Taniguchi, Ogaki (JP);
Dongdong Wang, Ogaki (JP);
Michimasa Takahashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 14/865,061

(22) Filed: Sep. 25, 2015

(65) Prior Publication Data
US 2016/0095207 A1     Mar. 31, 2016

(30) Foreign Application Priority Data

Sep. 25, 2014   (JP) ................................ 2014-194865

(51) Int. Cl.
*H05K 3/46*     (2006.01)
*H05K 1/02*     (2006.01)

(52) U.S. Cl.
CPC ......... *H05K 3/4691* (2013.01); *H05K 1/0206* (2013.01); *H05K 1/0207* (2013.01); *H05K 2201/0323* (2013.01); *H05K 2201/096* (2013.01)

(58) Field of Classification Search
CPC ......... H05K 3/4691; H05K 2201/0323; H05K 2201/096
See application file for complete search history.

(56) References Cited

U.S. PATENT DOCUMENTS

| | | | | |
|---|---|---|---|---|
| 5,835,356 A | * | 11/1998 | Wieloch ................. | H05K 1/021 174/252 |
| 2009/0114428 A1 | * | 5/2009 | Ueno ...................... | H05K 3/28 174/254 |
| 2009/0314523 A1 | * | 12/2009 | Ito ......................... | B32B 17/04 174/254 |
| 2010/0051325 A1 | * | 3/2010 | Sato ....................... | H05K 3/4691 174/254 |
| 2011/0067904 A1 | * | 3/2011 | Aoyama ............... | H05K 3/4069 174/254 |
| 2014/0355215 A1 | * | 12/2014 | Canete ................... | H05K 3/30 361/720 |

FOREIGN PATENT DOCUMENTS

JP     2012-134490 A     7/2012

* cited by examiner

*Primary Examiner* — Hoa C Nguyen
(74) *Attorney, Agent, or Firm* — Oblon, McClelland, Maier & Neustadt, L.L.P.

(57) ABSTRACT

A flex-rigid wiring board includes a flexible substrate, a first non-flexible substrate positioned on a first side of the flexible substrate, a second non-flexible substrate positioned on a second side of the flexible substrate, a first insulation layer laminated on first surfaces of the flexible substrate and first and second non-flexible substrates, and a second insulation layer laminated on second surfaces of the flexible substrate and first and second non-flexible substrates. Each of the first and second insulation layers has an opening portion exposing a portion of the flexible substrate such that the portion of the flexible substrate forms a flexible section connecting non-flexible rigid sections, and the first and second non-flexible substrates include a heat dissipating portion including a heat dissipating material having thermal conductivity which is higher than thermal conductivity of the first and second insulation layers.

20 Claims, 24 Drawing Sheets

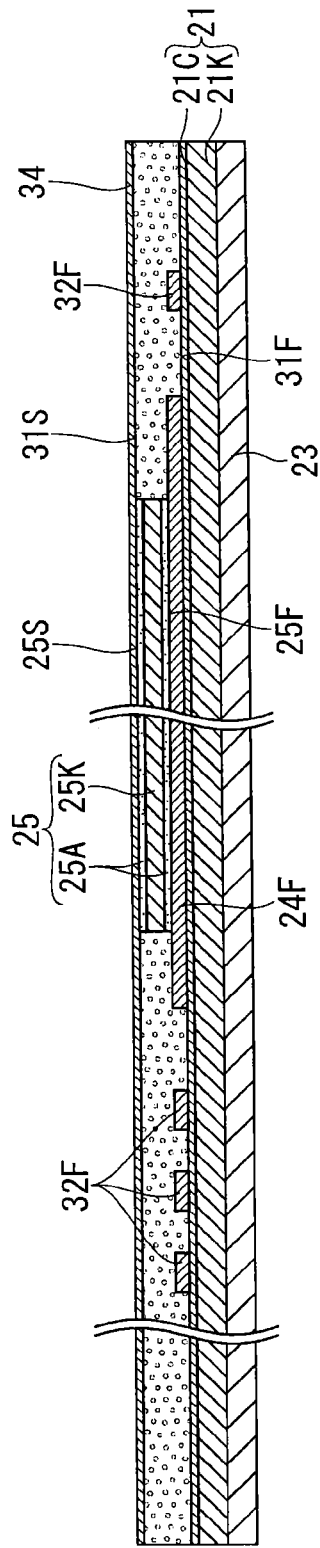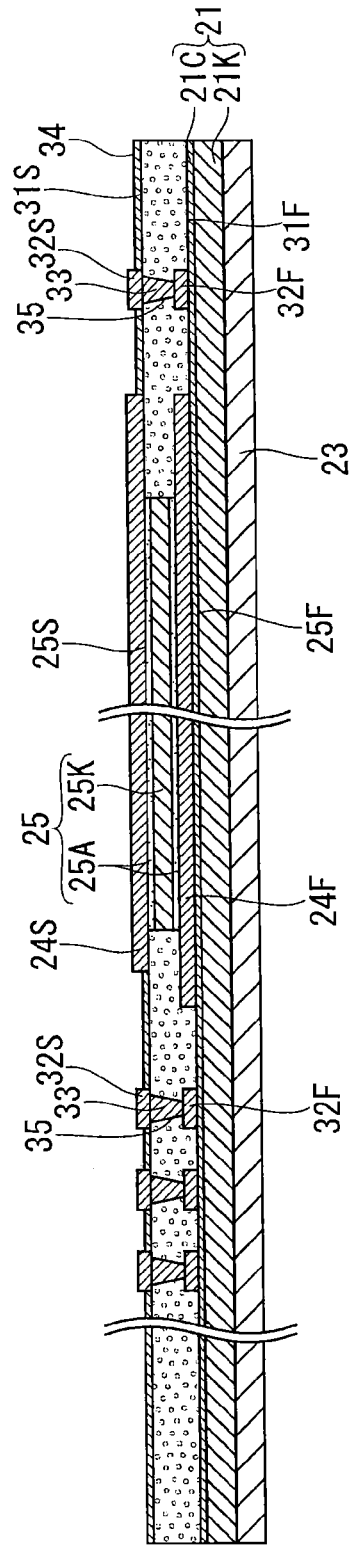
FIG. 6A
FIG. 6B

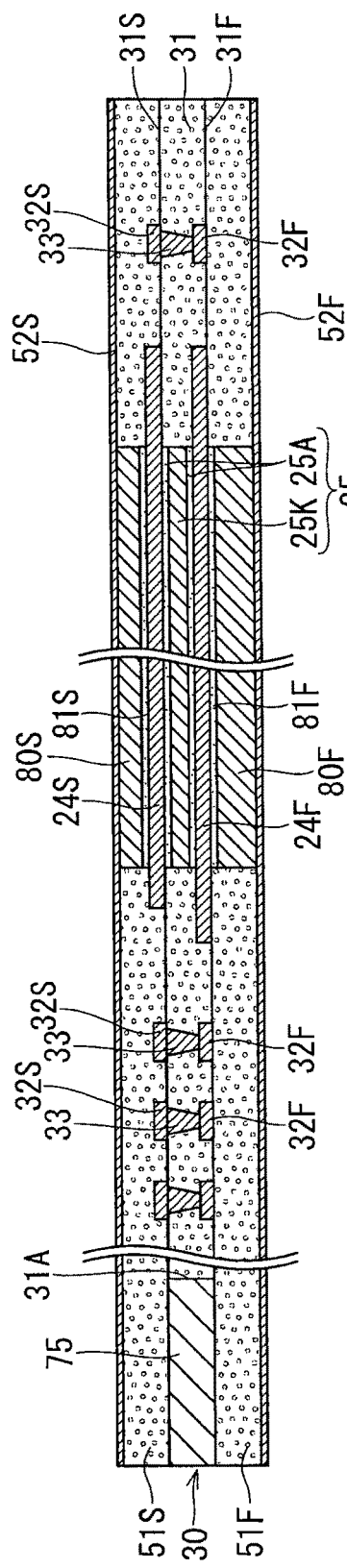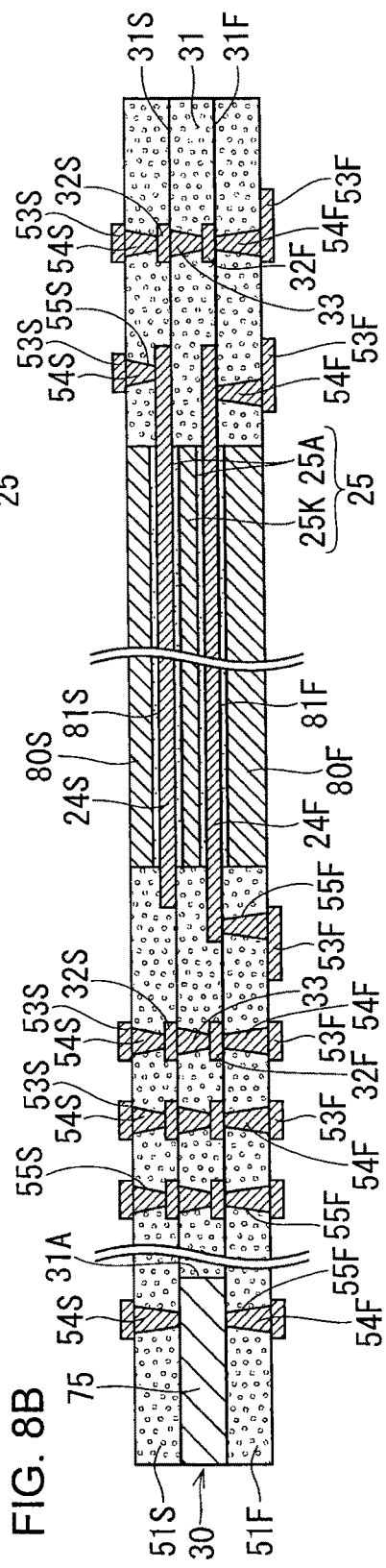
FIG. 8A
FIG. 8B

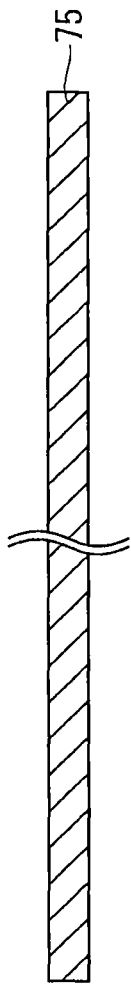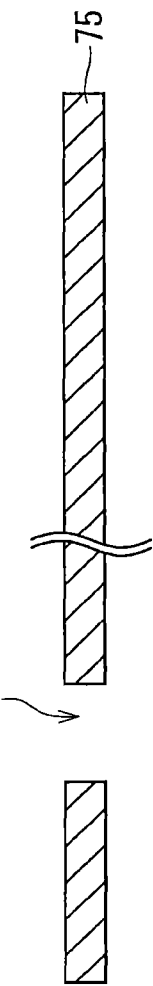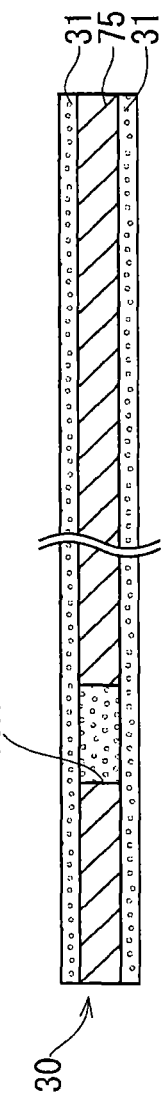

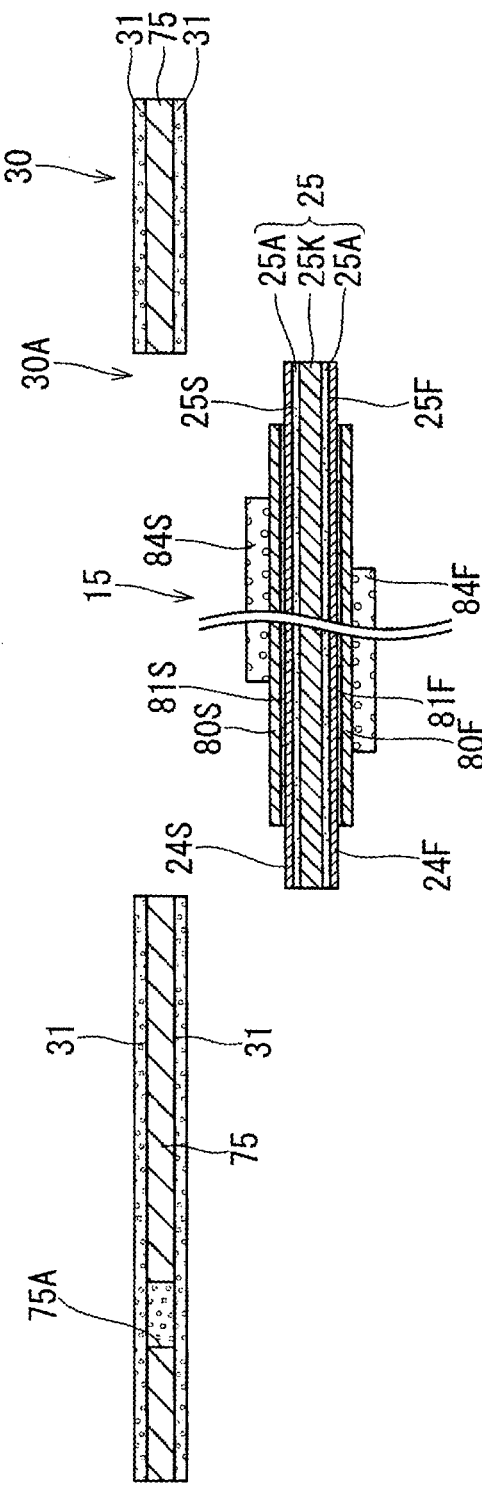
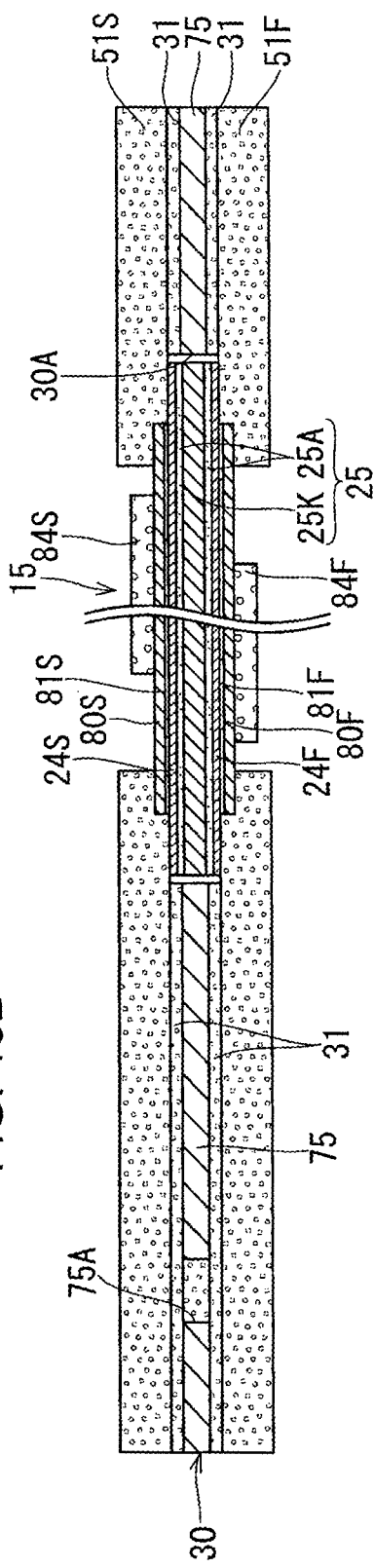
FIG. 16A
FIG. 16B

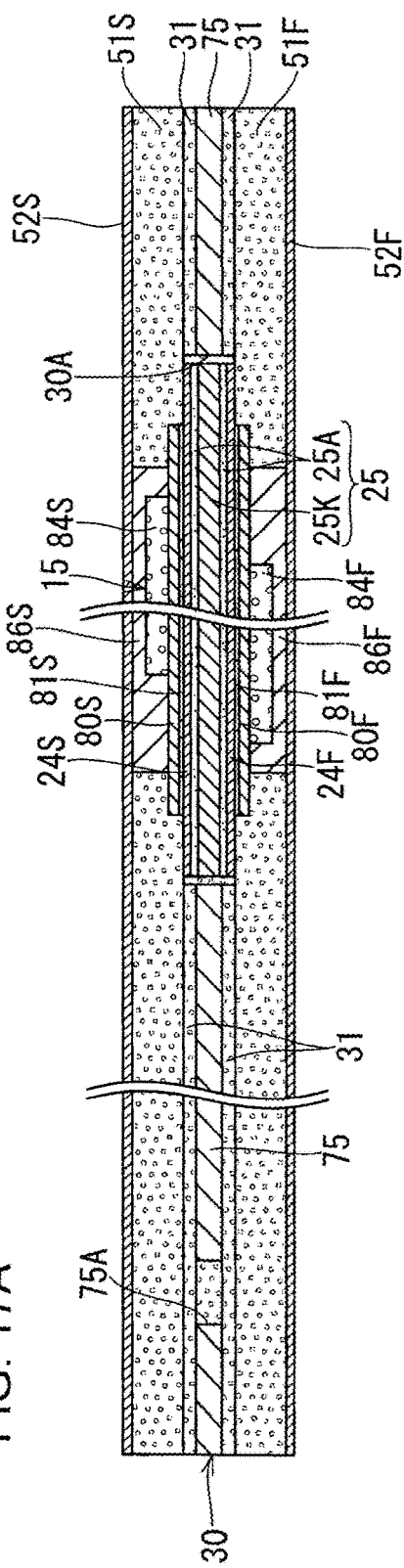
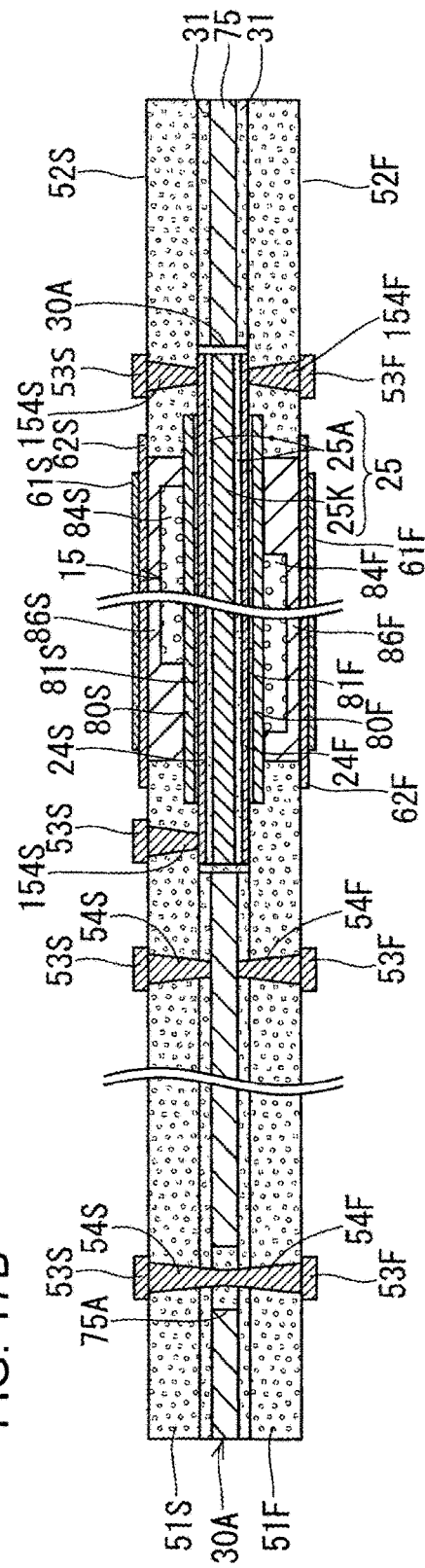

FLEX-RIGID WIRING BOARD

CROSS-REFERENCE TO RELATED APPLICATIONS

The present application is based upon and claims the benefit of priority to Japanese Patent Application No. 2014-194865, filed Sep. 25, 2014, the entire contents of which are incorporated herein by reference.

BACKGROUND OF THE INVENTION

Field of the Invention

The present invention relates to a flex-rigid wiring board structured to have a flexible section and a non-flexible rigid section positioned to be connected on a side of the flexible section.

Description of Background Art

JP2012-134490A describes a flex-rigid wiring board in which non-flexible buildup insulation layers are laminated on part of a flexible substrate so that a flexible section is formed where the flexible substrate is exposed, while a rigid section is formed where the buildup insulation layers are laminated. The entire contents of this publication are incorporated herein by reference.

SUMMARY OF THE INVENTION

According to one aspect of the present invention, a flex-rigid wiring board includes a flexible substrate, a first non-flexible substrate positioned on a first side of the flexible substrate, a second non-flexible substrate positioned on a second side of the flexible substrate, a first insulation layer laminated on first surfaces of the flexible substrate and first and second non-flexible substrates, and a second insulation layer laminated on second surfaces of the flexible substrate and first and second non-flexible substrates. Each of the first and second insulation layers has an opening portion exposing a portion of the flexible substrate such that the portion of the flexible substrate forms a flexible section connecting non-flexible rigid sections, and the first and second non-flexible substrates include a heat dissipating portion including a heat dissipating material having thermal conductivity which is higher than thermal conductivity of the first and second insulation layers.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 6A and 6B show steps for manufacturing a flex-rigid wiring board;

FIGS. 8A and 8B show steps for manufacturing a flex-rigid wiring board;

FIGS. 15A-15C show steps for manufacturing a flex-rigid wiring board;

FIGS. 16A and 16B show steps for manufacturing a flex-rigid wiring board;

FIGS. 17A and 17B show steps for manufacturing a flex-rigid wiring board;

DETAILED DESCRIPTION OF THE EMBODIMENTS

Figure 1:
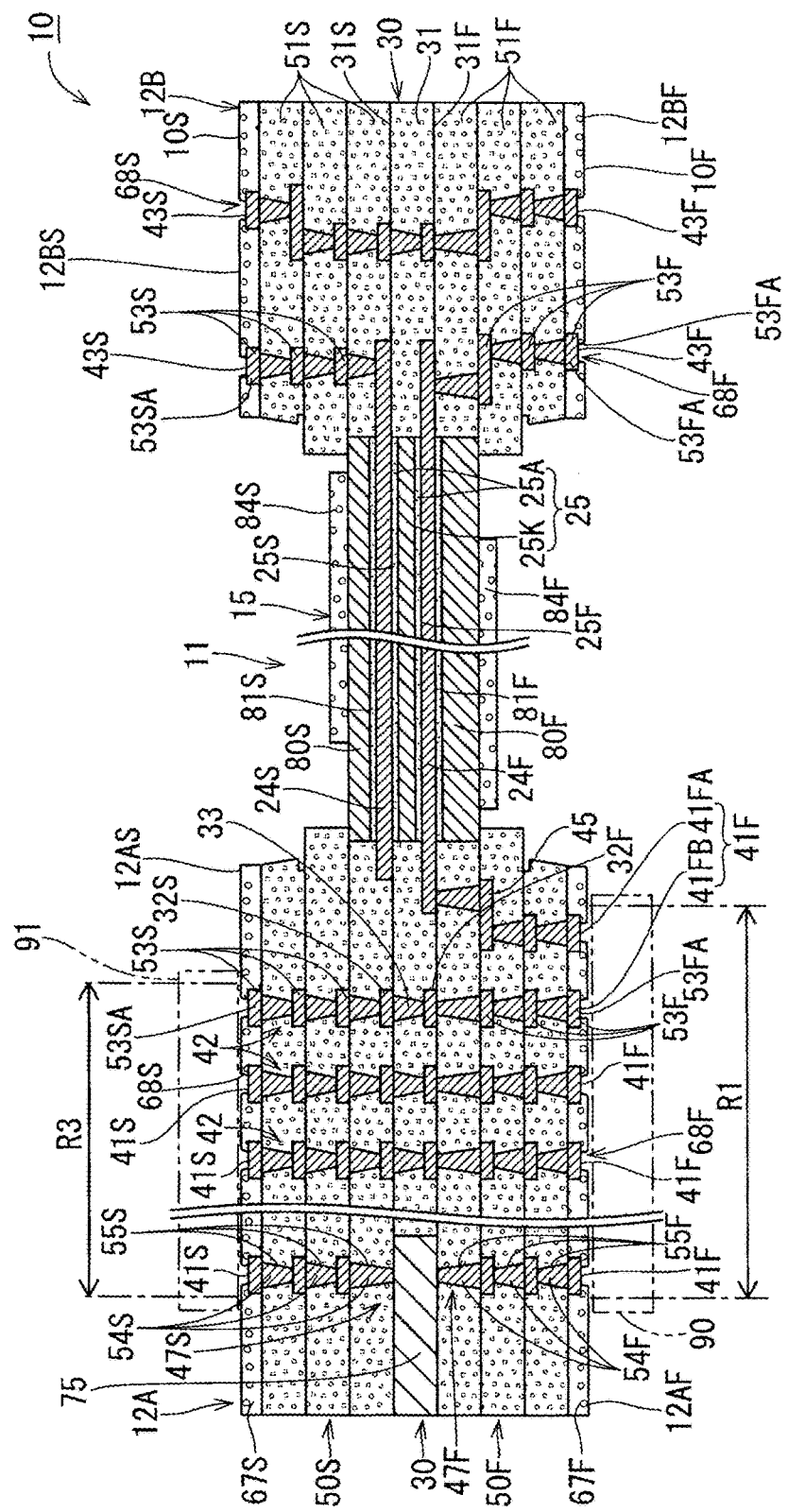
FIG. 1 shows a cross-sectional view of a flex-rigid wiring board according to a first embodiment of the present invention.

The embodiments will now be described with reference to the accompanying drawings, wherein like reference numerals designate corresponding or identical elements throughout the various drawings.

First Embodiment

A first embodiment of the present invention is described below by referring to FIG. 1~13. As shown in FIG. 1, flex-rigid wiring board 10 of the present embodiment has flexible substrate 15 and rigid substrates (30, 30) positioned to sandwich flexible substrate 15 when seen in a thickness direction. Buildup layers (50F, 50S) are laminated on upper and lower surfaces of flexible substrate 15 and non-flexible substrates (30, 30).

Buildup layers (50F, 50S) cover both side portions of flexible substrate 15 in a way to expose the center portion of flexible substrate 15. The exposed portion of flexible substrate 15 forms flexible section 11, and main rigid section (12A) and sub-rigid section (12B) that include non-flexible substrates 30 and buildup layers (50F, 50S) are formed respectively on both sides of flexible section 11. The "rigid section" of the present invention is formed with main rigid section (12A) and sub-rigid section (12B), which are connected by flexible section 11 to be bendable. Here, both side portions of flexible substrate 15 are slightly inserted into main rigid section (12A) and sub-rigid section (12B).

Flexible substrate 15 is made up of flexible intermediate substrate 25 formed by laminating adhesive layer (25A) on both surfaces of resin film (25K) such as polyimide film, first wiring layer (24F) formed on first surface (25F), which is either an upper or a lower surface of flexible intermediate substrate 25, and second wiring layer (24S) formed on second surface (25S), which is the opposing other surface of flexible intermediate substrate 25. Multiple straight wiring lines are formed in first wiring layer (24F) and second wiring layer (24S) to connect main rigid section (12A) and sub-rigid section (12B) (see FIG. 2, which shows only first wiring layer (24F)). More specifically, each of both end portions of first and second wiring layers (24F, 24S) protrudes sideways from flexible intermediate substrate 25 and is inserted into non-flexible substrate 30. First wiring layer (24F) and second wiring layer (24S) may be connected by vias penetrating through flexible intermediate substrate 25.

Adhesive layer (81F) is formed on first wiring layer (24F), and coverlay (cover layer) (80F) is formed on adhesive layer (81F). Also, adhesive layer (81S) is formed on second wiring layer (24S), and coverlay (cover layer) (80S) is formed on adhesive layer (81S). Coverlays (80F, 80S) are covered by solder-resist layers (84F, 84S). Coverlays (80F, 80S) are made of insulative film such as polyimide.

Non-flexible substrate 30 is formed with, for example, non-flexible intermediate substrate 31 made of insulative material such as prepreg (B-stage resin sheet prepared by impregnating a core material with resin), and heat-dissipation member 75 (corresponds to "heat dissipating material," as referred to in the present invention) made of a material having higher thermal conductivity than the material for forming non-flexible intermediate substrate 31. Heat-dissipation member 75 of the present embodiment is positioned on one end of non-flexible substrate 30, and one side surface of heat-dissipation member 75 is exposed to the outside. Examples for forming heat-dissipation member 75 are carbonic materials such as graphite and metallic materials such as copper.

First intermediate conductive layer (32F) is formed on first surface (31F), which is either an upper or a lower surface of non-flexible intermediate substrate 31, and second intermediate conductive layer (32S) is formed on second surface (31S), which is the opposing other surface. First and second intermediate conductive layers (32F, 32S) are positioned not to interfere with heat-dissipation member 75.

Buildup insulation layers (51F) and buildup conductive layers (53F) are alternately laminated on first intermediate conductive layer (32F) and heat-dissipation member 75. Also, buildup insulation layers (51S) and buildup conductive layers (53S) are alternately laminated on second intermediate conductive layer (32S). The aforementioned buildup layer (50F) is made up of buildup insulation layers (51F) and buildup conductive layers (53F), and the aforementioned buildup layer (50S) is made up of buildup insulation layers (51S) and buildup conductive layers (53S). Buildup insulation layers (51F, 51S) are made of the same material as that of non-flexible intermediate substrate 31 and correspond to "insulation layers," as referred to in the present invention.

Solder-resist layers (67F, 67S) are laminated on buildup conductive layers (53F, 53S) formed to be positioned outermost (hereinafter may also be referred to as "outermost buildup conductive layers (53FA, 53SA)." Solder-resist layer (67F) is formed to be first surface (10F) positioned on either an upper or a lower side of flex-rigid wiring board 10, and solder-resist layer (67S) is formed to be second surface (10S) positioned on the opposing other side of flex-rigid wiring board 10.

In solder-resist layer (67F) on the first-surface (10F) side of flex-rigid wiring board 10, multiple openings (68F) are formed to expose portions of outermost buildup conductive layer (53FA). When portions of outermost buildup conductive layer (53FA) are exposed through multiple openings (68F), multiple first pads (41F) for mounting an electronic component are formed on first surface (12AF), which is either an upper or a lower surface of main rigid section (12A), while multiple mounting pads (43F) are formed on first surface (12BF), which is either an upper or a lower surface of sub-rigid section (12B). In solder-resist layer (67S) on the second-surface (10S) side of flex-rigid wiring board 10, multiple openings (68S) are formed to expose portions of outermost buildup conductive layer (53SA). When portions of outermost buildup conductive layer (53SA) are exposed through multiple openings (68S), multiple second pads (41S) for mounting an electronic component are formed on second surface (12AS), which is the opposing other surface of main rigid section (12A), and multiple mounting pads (43S) are formed on second surface (12BS), which is the opposing other surface of sub-rigid section (12B).

Figure 2:
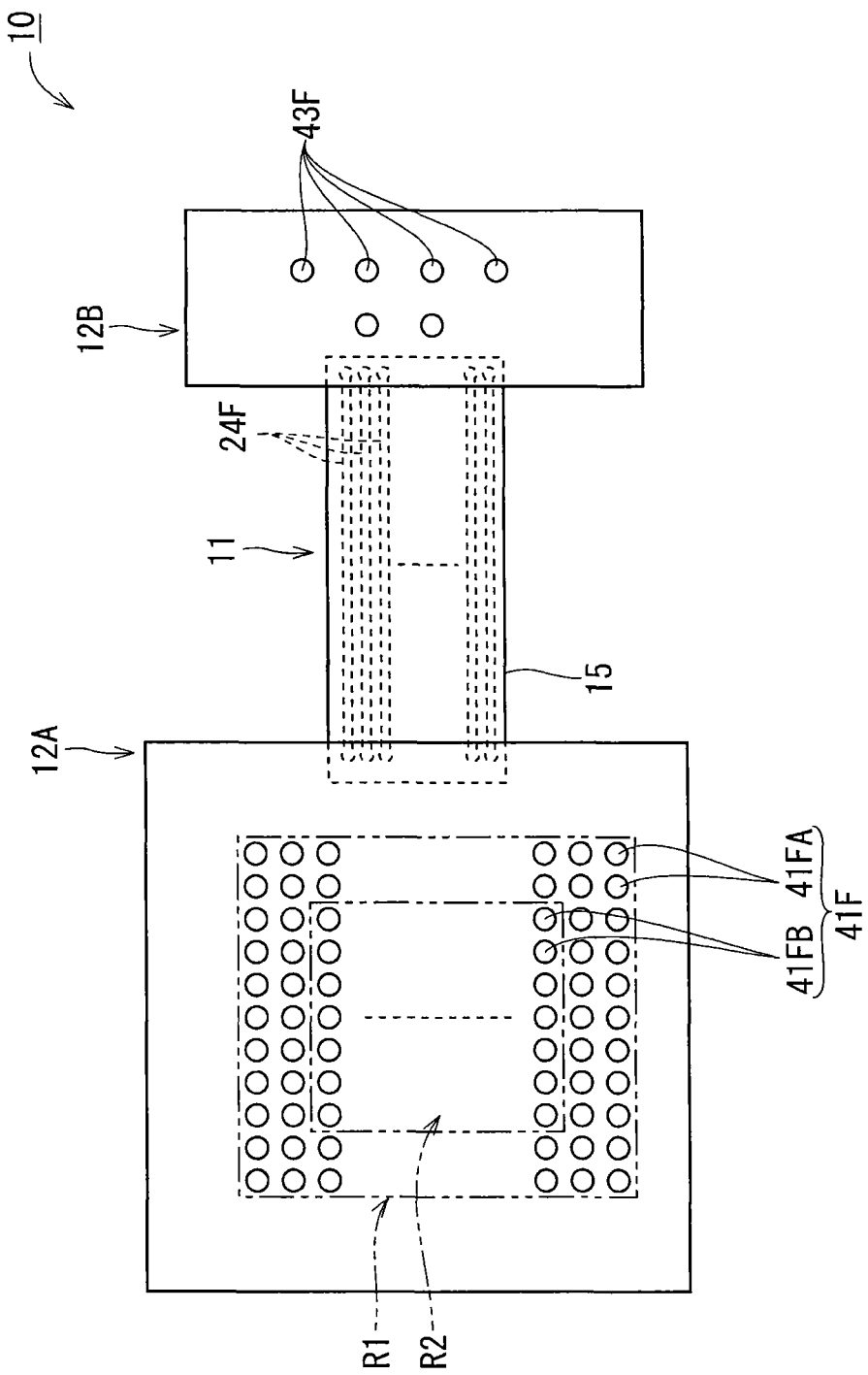
FIG. 2 shows a plan view of the flex-rigid wiring board.

As shown in FIG. 2, multiple first pads (41F) and second pads (41S) formed respectively on the upper and lower surfaces of main rigid section (12A) are arrayed in a grid pattern (FIG. 2 shows only first pads (41F)). The pitch is set at 250~500 μm for both first and second pads (41F, 41S). As described above, side portions of flexible substrate 15 are respectively inserted into main rigid section (12A) and sub-rigid section (12B) (both side portions of flexible substrate 15 are shown by dotted lines in FIG. 2). When main rigid section (12A) is observed in a thickness direction, the end portion of flexible substrate 15 on the main-rigid-section (12A) side is positioned on the outer side of array region (R1) where first pads (41F) are arrayed.

As shown in FIG. 1, some of first pads (41F) on the first-surface (10F) side of flex-rigid wiring board 10 are connected to sub-rigid section (12B) by first wiring layer (24F) of flexible substrate 15. More specifically, outer pads (41FA) positioned on the periphery of array region (R1) among multiple first pads (41F) are connected to sub-rigid section (12B), whereas inner pads (41FB) positioned on the inner side of outer pads (41FA) in array region (R1) are connected to second pads (41S) on the second-surface (12AS) side of main rigid section (12A), as shown in FIGS. 1 and 2. In the present embodiment, array region (R2) (see FIG. 2) for inner pads (41FB) is positioned to correspond to array region (R3) for second pads (41S) (see FIG. 1). Further, array region (R1) for first pads (41F) and inner region (R2) for inner pads (41FB) are both shaped to be rectangular in the example shown in FIG. 2.

Figure 3:
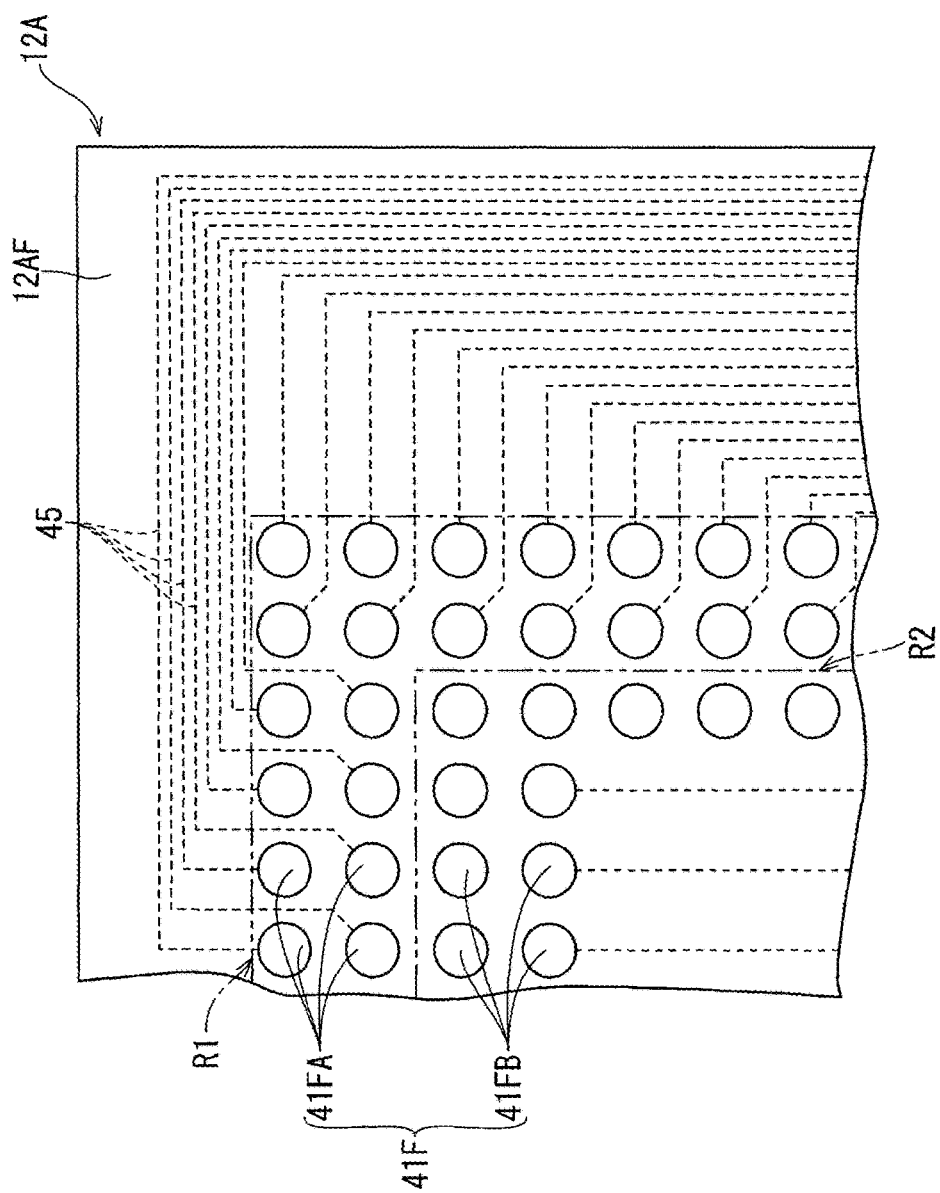
FIG. 3 shows wiring distribution to connect first pads and the flexible section.

As shown in FIG. 1, wiring lines 45 to connect outer pads (41FA) and first wiring layer (24F) are formed by patterning part of buildup conductive layer (53F). As shown in FIG. 3, wiring lines 45 are positioned on the outer side of inner region (R2) for inner pads (41FB) so as not to pass through inner pads (41FB). By so setting, the pitch of inner pads (41FB) is reduced, resulting in high-density inner pads (41FB).

Some of inner pads (41FB) are connected to heat-dissipation member 75 through first stacked vias (47F). First stacked vias (47F) are formed by stacking in a straight line multiple via conductors (54F) that penetrate through multiple buildup insulation layers (51F). In this embodiment of the present invention, via conductors (54F) correspond to "first via conductors."

In addition, some of second pads (41S) are connected to heat-dissipation member 75 through second stacked vias (47S). Second stacked vias (47S) are formed by stacking in a straight line multiple via conductors (54S) that penetrate through multiple buildup insulation layers (51S). In this embodiment of the present invention, via conductors (54S) correspond to "second via conductors."

Some of first pads (41F) and second pads (41S) are connected by all-layer stacked vias 42 that penetrate entirely through main rigid section (12A). All-layer stacked vias 42 are formed by stacking in a straight line via conductors 33 penetrating through non-flexible substrate 30 (in particular, non-flexible intermediate substrate 31), via conductors (54F) penetrating through buildup insulation layers (51F), and via conductors (54S) penetrating through buildup insulation layers (51S).

Figure 4:
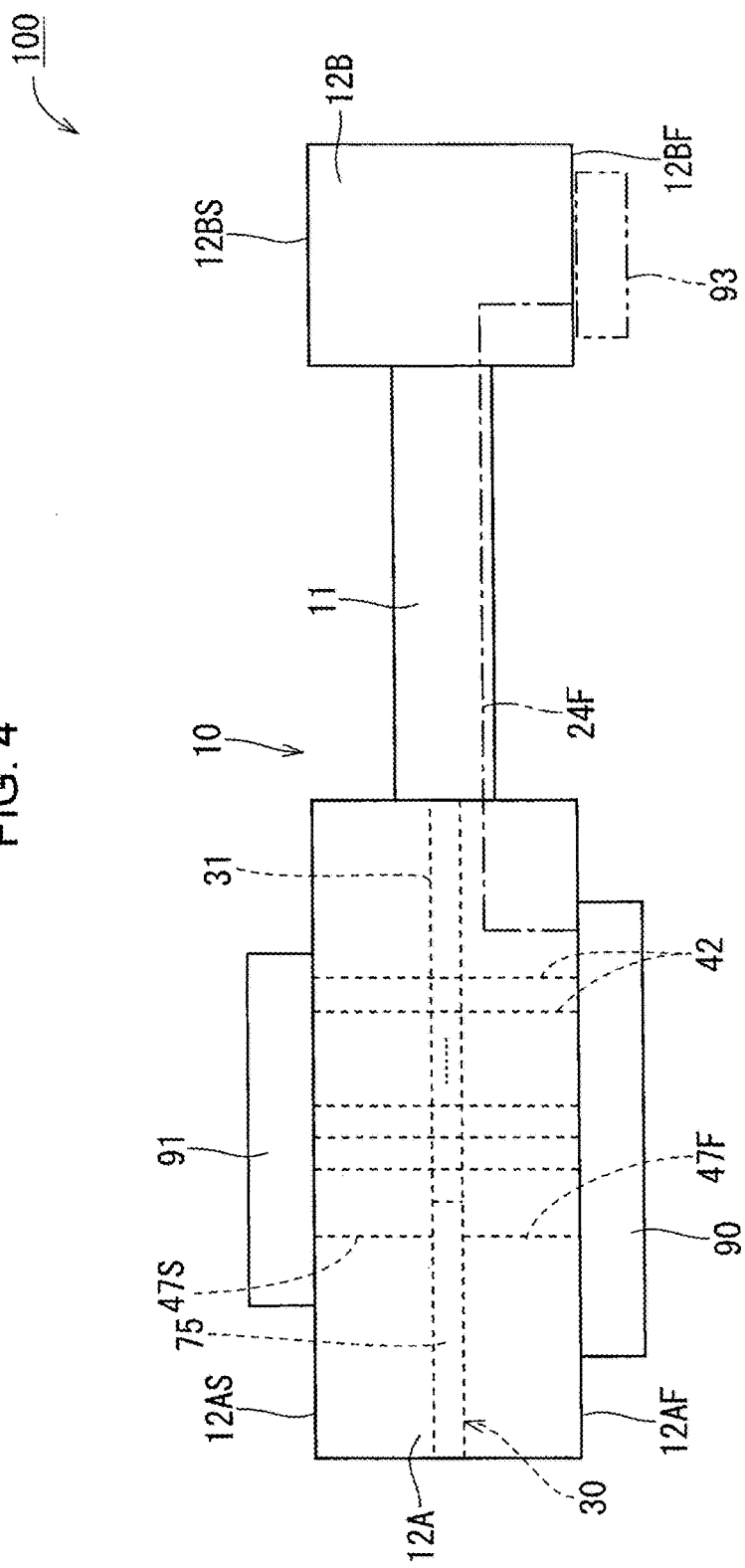
FIG. 4 shows a side view of a semiconductor module.

As shown in FIGS. 1 and 4, active component 90 is mounted on first pads (41F), and passive component 91 is mounted on second pads (41S). Semiconductor module 100 is structured to have flex-rigid wiring board 10, active component 90 and passive component 91. Active component 90 is connected to passive component 91 through inner pads (41FB) among first pads (41F) (see FIG. 1). Active component 90 is connected to sub-rigid section (12B) through outer pads (41FA) among first pads 41 (see FIG. 1), and is further connected to mounting pads (43F, 43S) through wiring lines (not shown) formed in sub-rigid section (12B). Electronic component 93 such as a connector may also be mounted on mounting pads (43F, 43S). Examples of active component 90 are semiconductor elements and ICs. An IC is mounted in the present embodiment. Examples of passive component 91 are chip capacitors, inductors, resistors, Piezoelectric components and the like. The structure of flex-rigid wiring board 10 has been described above.

Manufacturing of Flex-Rigid Wiring Board

A method for manufacturing flex-rigid wiring board 10 is described below with reference to FIG. 5~13.

Figure 5A:
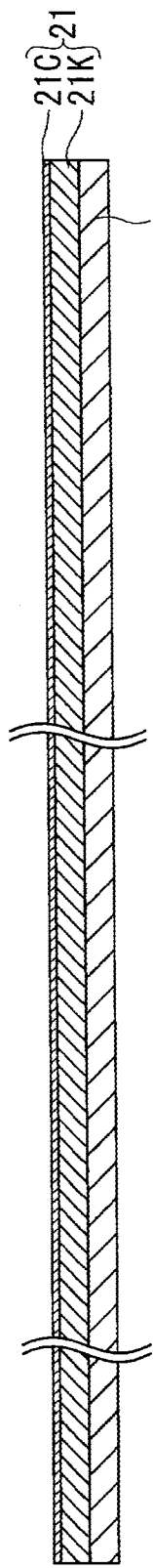
FIGS. 5A-5C show steps for manufacturing a flex-rigid wiring board.

(1) As shown in FIG. 5A, carrier 21 made by laminating copper foil (21C) on an upper surface of insulative base (21K) is laminated on support base 23. An adhesive layer (not shown) is formed between insulative base (21K) and copper foil (21C) as well as between carrier 21 (insulative base (21K)) and support base 23. The adhesive strength between insulative base (21K) and copper foil (21C) is set weaker than that between carrier 21 (insulative base (21K)) and support base 23.

Figure 5B:
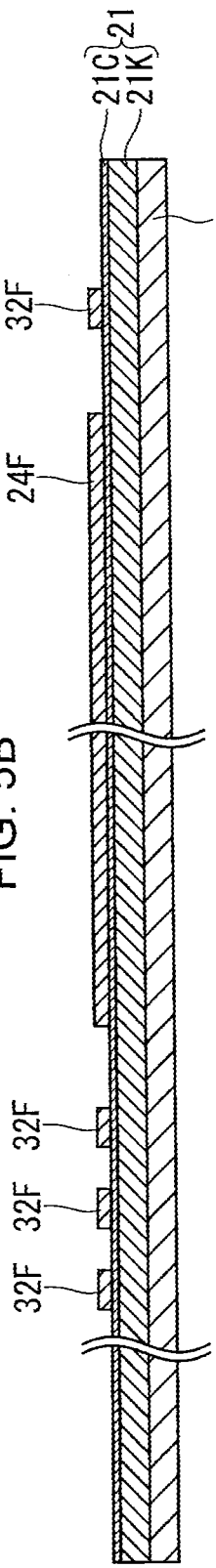

(2) A resist process and electrolytic plating are performed on copper foil (21C) so that first wiring layer (24F) and first intermediate conductive layer (32F) are formed on copper foil (21C) to have a predetermined pattern (see FIG. 5B). At that time, first intermediate conductive layer (32F) is positioned at both end portions of carrier 21, while first wiring layer (24F) is positioned near the central portion of carrier 21.

Figure 5C:
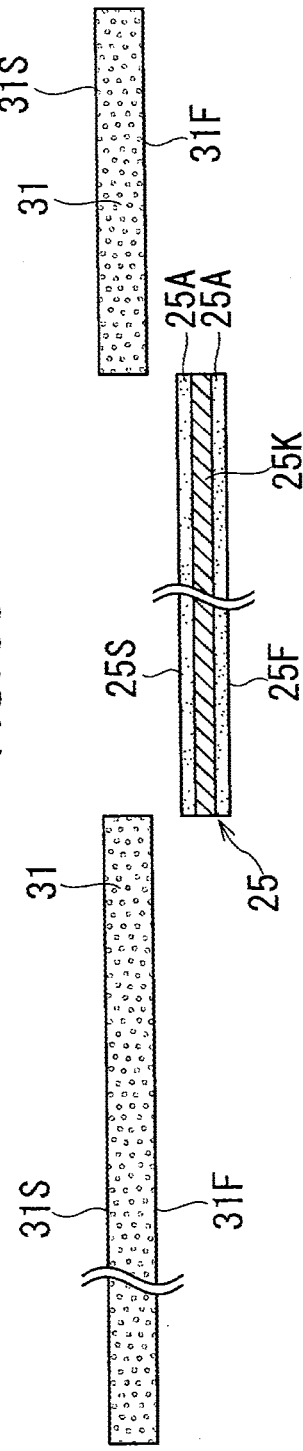

(3) As shown in FIG. 5C, flexible intermediate substrate 25 is prepared by laminating adhesive layer (25A) on both surfaces of resin film (25K), and non-flexible substrates (31, 31) are positioned with a space large enough to accommodate flexible intermediate substrate 25.

(4) As shown in FIG. 6A, flexible intermediate substrate 25 is laminated on carrier 21 from the first-surface (25F) side, while non-flexible intermediate substrates (31, 31) are laminated from the first-surface (31F) side. Moreover, copper foil 34 is laminated and pressed on second surfaces (31S, 31S) of non-flexible intermediate substrates (31, 31) and on second surface (25S) of flexible intermediate substrate 25. At that time, flexible intermediate substrate 25 is positioned on first wiring layer (24F), and non-flexible intermediate substrates (31, 31) are positioned to horizontally sandwich flexible intermediate substrate 25. In addition, first wiring layer (24F) and first intermediate conductive layer (32F) are embedded in flexible intermediate substrate 25 and non-flexible intermediate substrates (31, 31).

(5) By using a laser, openings 35 are formed in non-flexible intermediate substrates (31, 31) and copper foil 34 so as to expose portions of first intermediate conductive layer (32F). Electroless plating, plating resist and electrolytic plating procedures are performed so that second wiring layer (24S) and second conductive layer (32S) are formed in portions where no plating resist exists, while via conductors 33 are formed in openings 35, as shown in FIG. 6B. Multiple wiring lines are formed in second wiring layer (24S) so as to connect non-flexible intermediate substrates (31, 31) (see FIG. 2), and both end portions of second wiring layer (24S) are positioned on second surfaces (31S, 31S) of non-flexible intermediate substrates (31, 31).

Figure 7A:
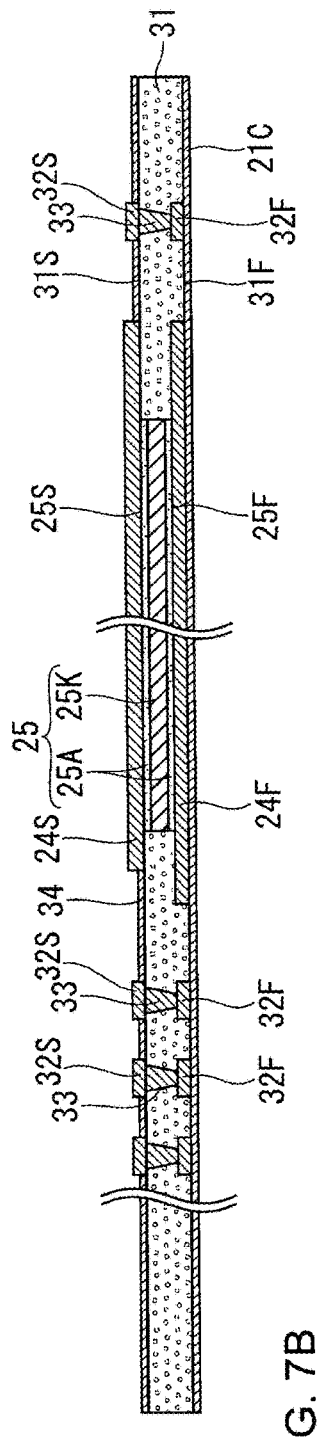
FIGS. 7A-7C show steps for manufacturing a flex-rigid wiring board.

(6) As shown in FIG. 7A, insulative base (21K) of carrier 21 and support base 23 are removed so that copper foil (21C) is exposed on the first-surface (31F) side of non-flexible intermediate substrate 31.

Figure 7B:
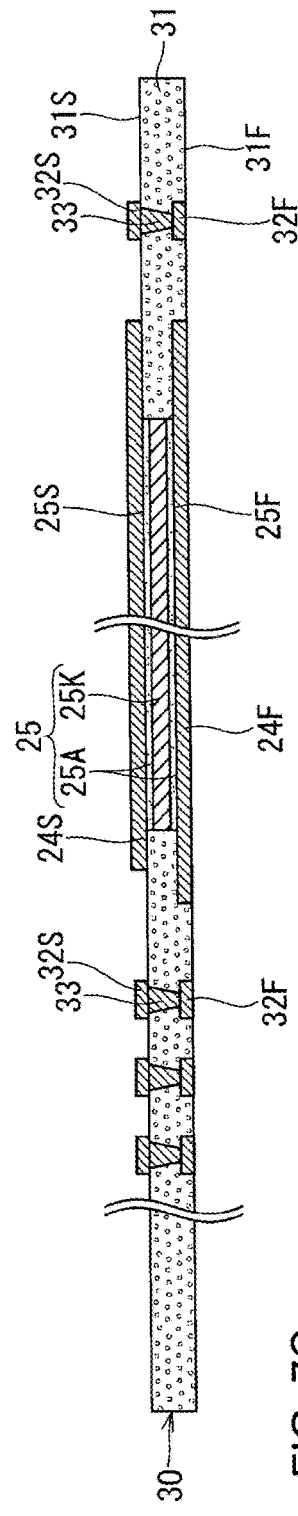

(7) As shown in FIG. 7B, copper foil (21C) and copper foil 34 are etched. At that time, second wiring layer (24S) and second intermediate conductive layer (32S) are set to protrude respectively from second surface (25S) of flexible intermediate substrate 25 and second surface (31S) of non-flexible intermediate substrate 31, while first wiring layer (24F) and first intermediate conductive layer (32F) are embedded respectively in flexible intermediate substrate 25 and non-flexible intermediate substrate 31.

Figure 7C:
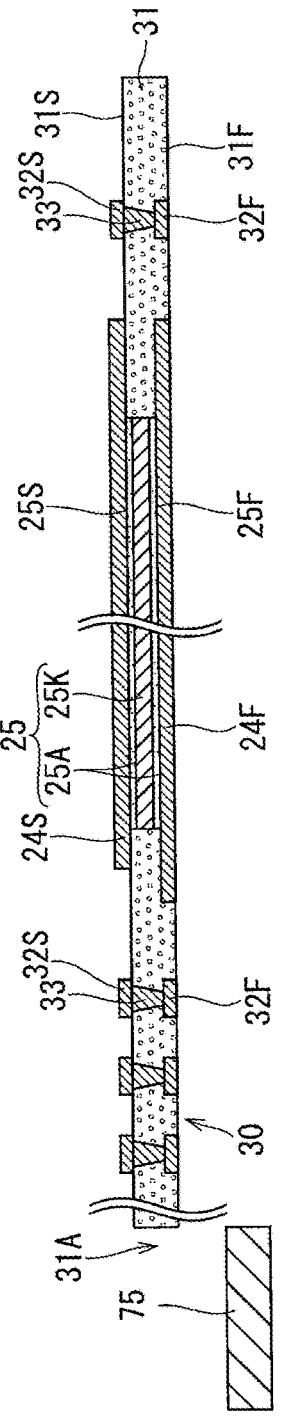

(8) As shown in FIG. 7C, heat-dissipation member 75 is prepared, while opening (31A) is formed in non-flexible intermediate substrate 31 in a size large enough to accommodate heat-dissipation member 75. In particular, opening (31A) is formed to have a slightly greater size than that of heat-dissipation member 75.

(9) Coverlay (80F) is laminated on the central portion of first wiring layer (24F) with adhesive layer (81F) disposed in between, and coverlay (80S) is laminated on the central portion of second wiring layer (24S) with adhesive layer (81S) disposed in between. Heat-dissipation member 75 is accommodated in opening (31A) of non-flexible intermediate substrate 31. Buildup insulation layer (51F) made of prepreg is laminated on first-surface (31F) of non-flexible intermediate substrate 31 and on both end portions of first wiring layer (24F), and buildup insulation layer (51S) is laminated on second-surface (31S) of non-flexible intermediate substrate 31 and on both end portions of second wiring layer (24S). Copper foils (52F, 52S) are laminated on coverlays (80F, 80S) and buildup insulation layers (51F, 51S) (see FIG. 8A). At that time, the gap between opening (31A) and heat-dissipation member 75 is filled with insulative material for forming non-flexible intermediate substrate 31 or for forming buildup insulation layers (51F, 51S).

(10) Using a laser, openings (55F) are formed in buildup insulation layer (51F) so as to expose portions of first wiring layer (24F), first intermediate conductive layer (32F) and heat-dissipation member 75, and openings (55S) are formed in buildup insulation layer (51S) so as to expose portions of second wiring layer (24S), second intermediate conductive layer (32S) and heat-dissipation member 75. By the same process as in (5) above, via conductors (54F, 54S) and buildup conductive layers (53F, 53S) are formed, and copper foils (52F, 52S) are etched (FIG. 8B). At that time, some of via conductors (54F, 54S) are connected to heat-dissipation member 75.

Figure 9A:
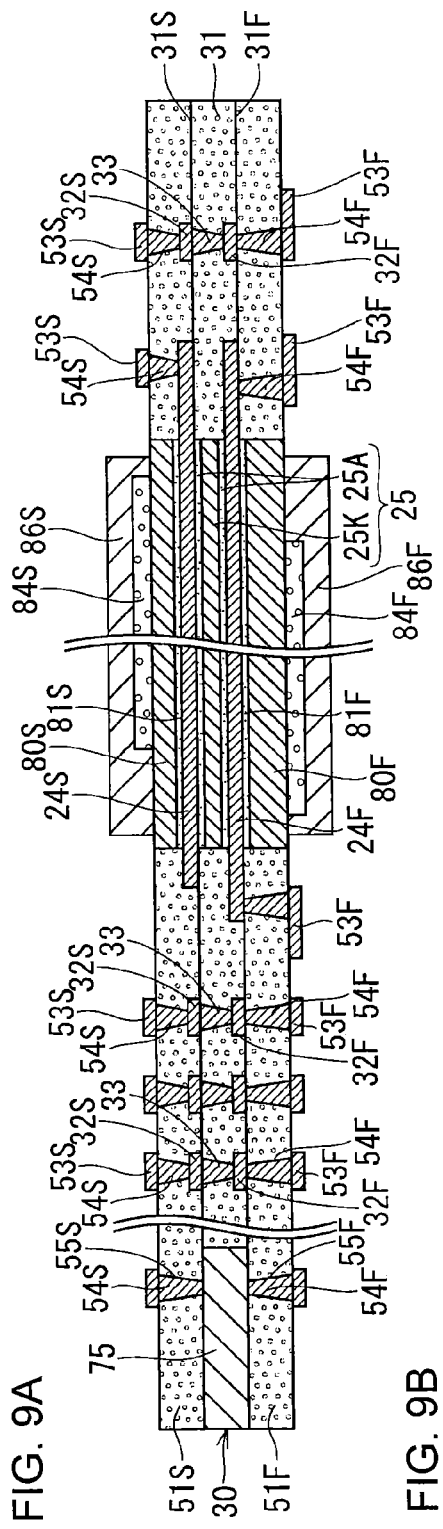
FIGS. 9A and 9B show steps for manufacturing a flex-rigid wiring board.

(11) As shown in FIG. 9A, solder-resist layer (84F) is formed on coverlay (80F), and release layer (86F) is formed on solder-resist layer (84F). In addition, solder-resist layer (84S) is formed on coverlay (80S), and release layer (86S) is formed on solder-resist layer (84S).

Figure 9B:
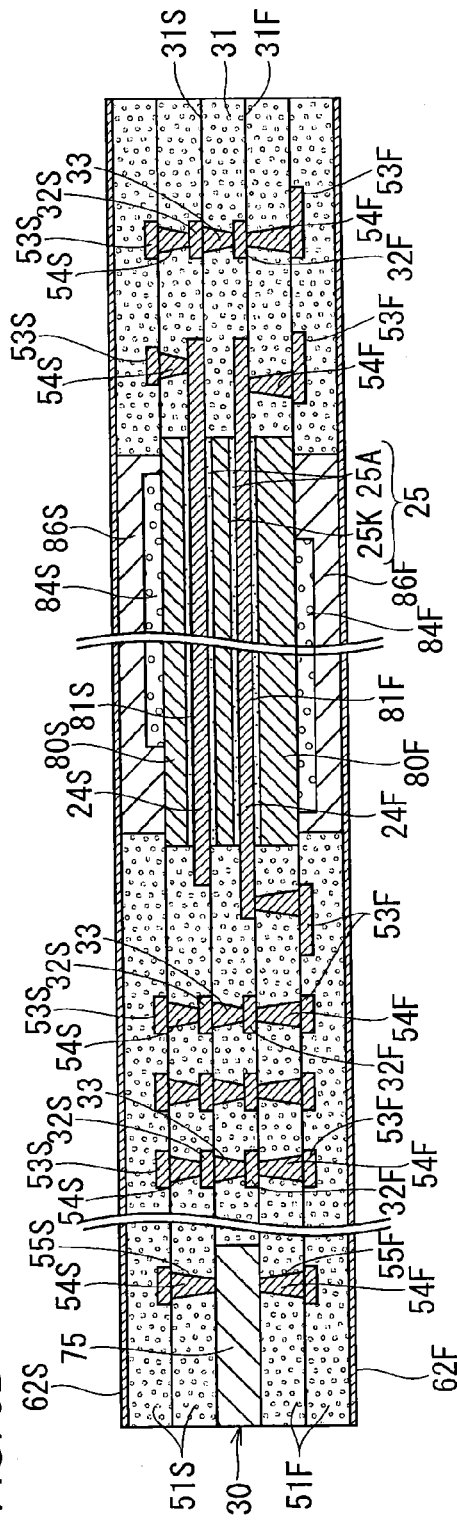
Figure 10:
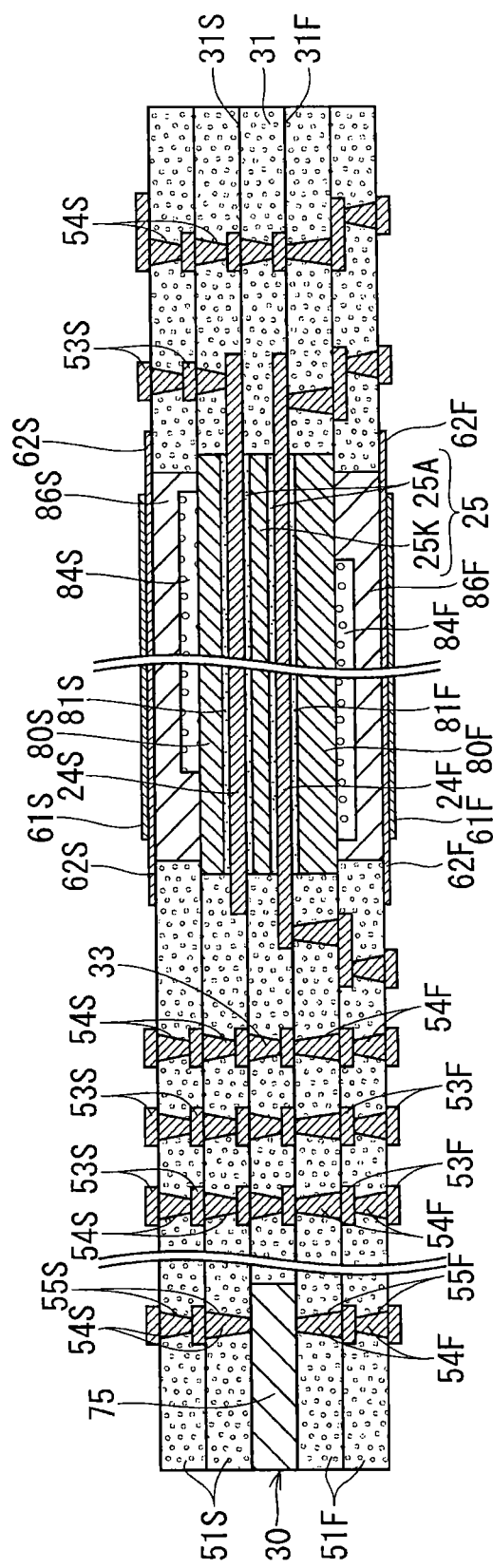
FIG. 10 shows a step for manufacturing a flex-rigid wiring board.
Figure 11:
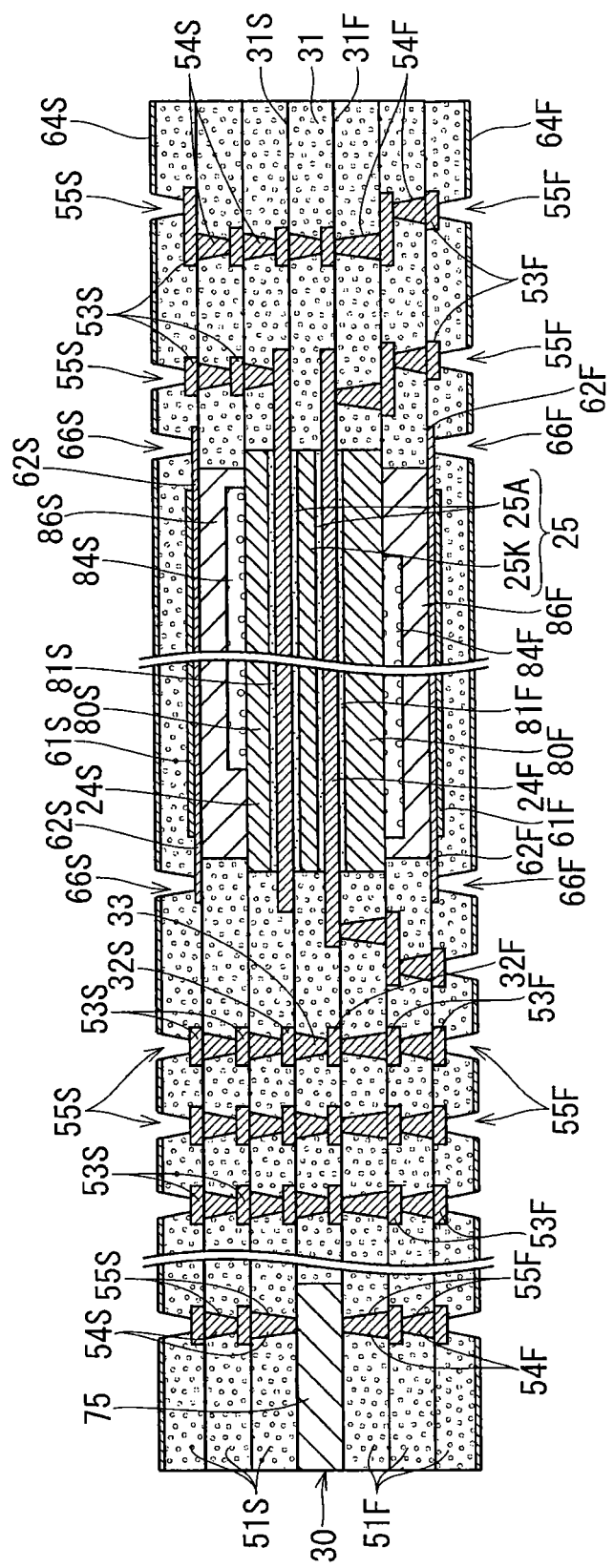
FIG. 11 shows a step for manufacturing a flex-rigid wiring board.
Figure 12:
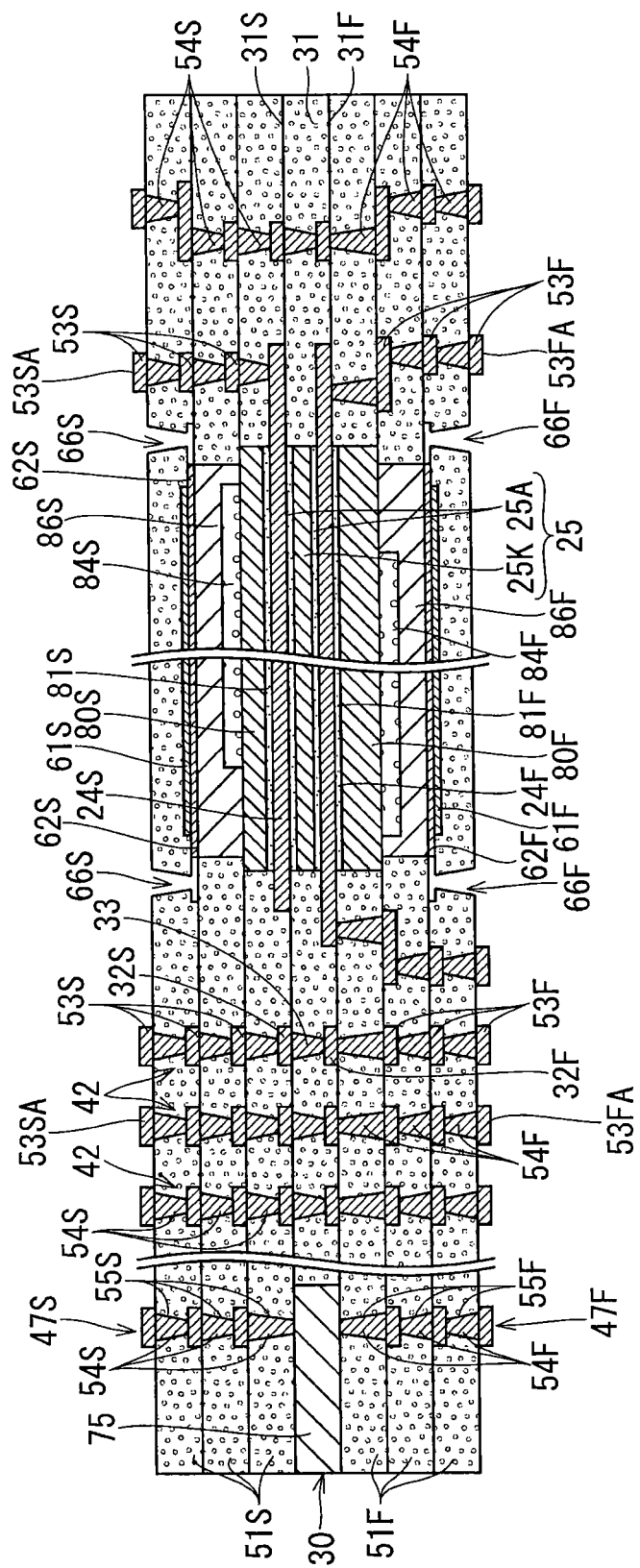
FIG. 12 shows a step for manufacturing a flex-rigid wiring board.

(12) As shown in FIG. 9B, buildup insulation layer (51F) is formed on both horizontal sides of solder-resist layer (84F) and release layer (86F), and buildup insulation layer (51S) is formed on both horizontal sides of solder-resist layer (84S) and release layer (86S). Then, copper foils (62F, 62S) are laminated on buildup insulation layers (51F, 51S).

(13) By the same process as in (10) above, openings (55F, 55S) are formed in buildup insulation layers (51F, 51S), via conductors (54F, 54S) are formed to penetrate through buildup insulation layers (51F, 51S), and buildup conductive layers (53F, 53S) are formed on buildup insulation layers (51F, 51S). In addition, release conductors (61F, 61S) are formed over release layers (86F, 86S) in such a way to expose copper foils (62F, 62S) on end portions (see FIG. 10).

(14) Buildup insulation layers (51F, 51S) and copper foils (64F, 64S) are laminated on buildup conductive layers (53F, 53S) and on release conductors (61F, 61S). Then, by using a laser, openings (55F, 55S) are formed in buildup insulation layers (51F, 51S) so as to expose portions of buildup conductive layers (53F, 53S), and slits (66F, 66S) are formed to expose copper foils (62F, 62S) on the periphery of release conductors (61F, 61S) (see FIG. 11).

(15) By the same process as in (10) above, via conductors (54F, 54S) are formed to penetrate through buildup insulation layers (51F, 51S), and buildup conductive layers (53F, 53S) are formed on buildup insulation layers (51F, 51S). Buildup conductive layers (53F, 53S) formed here are referred to as outermost buildup conductive layers (53FA, 53SA). In addition, portions of copper foils (62F, 62S), that are positioned on the outer side of release layers (86F, 86S), are removed from the bottoms of slits (66F, 66S) (see FIG. 12). At that time, multiple via conductors (54F, 54S) are stacked in a thickness direction to be connected to via conductors 33 positioned either to the left or to the right of flexible intermediate substrate 25 (left in the example shown in FIG. 12). Those via conductors (33, 54F, 54S) form all-layer stacked vias 42. On the first-surface (31F) side and on the second-surface (31S) side respectively of non-flexible intermediate substrate 31, multiple via conductors (54F) for forming first stacked vias (47F) and multiple via conductors (54S) for forming second stacked vias (47S) are stacked to be connected to heat-dissipation member 75.

Figure 13:
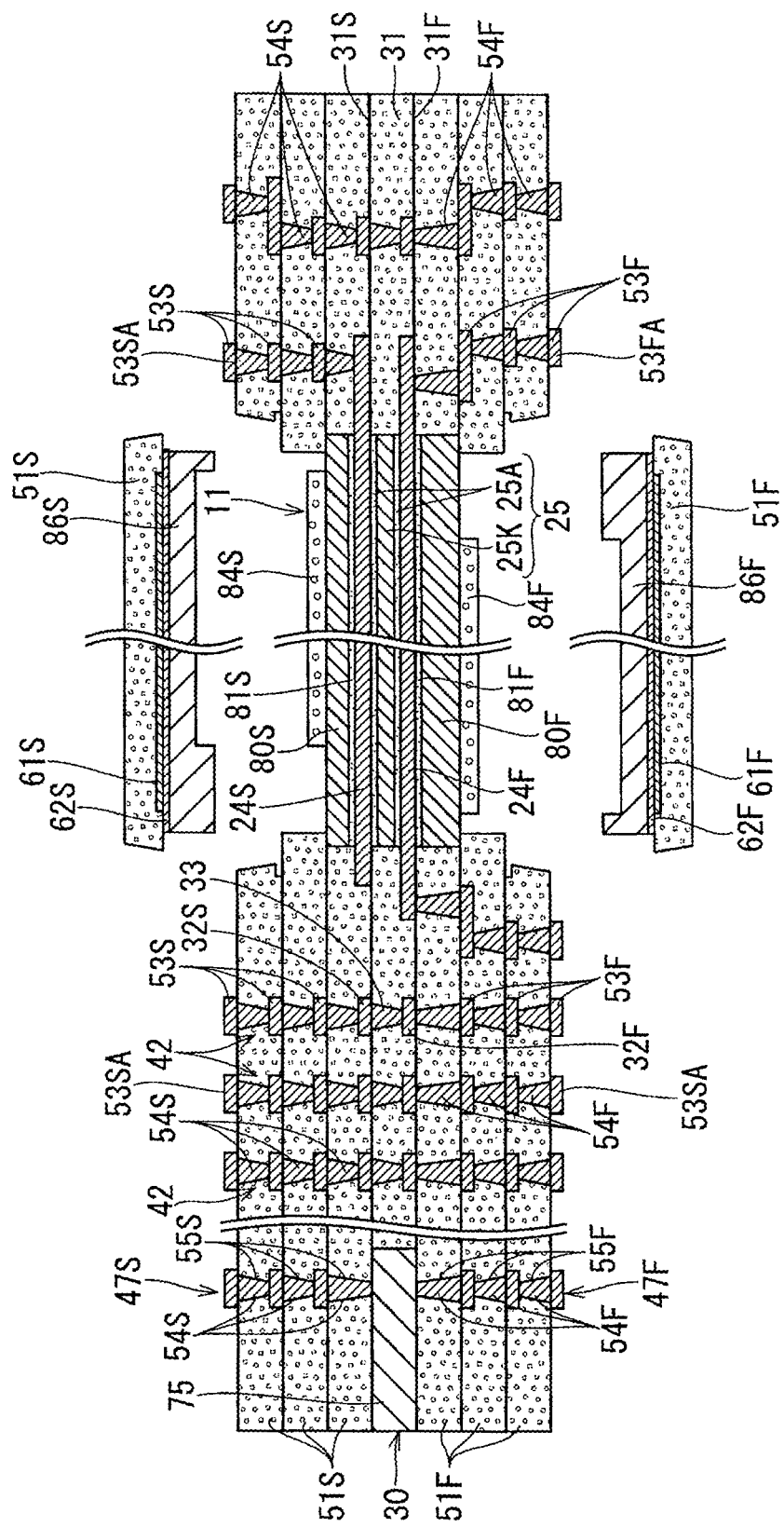
FIG. 13 shows a step for manufacturing a flex-rigid wiring board.

(16) As shown in FIG. 13, release layers (86F, 86S) on solder-resist layers (84F, 84S) and buildup insulation layers (51S, 51F) on the inner side of slits (66F, 66S) are removed. At that time, part of flexible substrate 15, that is, flexible intermediate substrate 25, coverlays (80F, 80S) and solder-resist layers (84F, 84S), is exposed. The exposed part makes up flexible section 11.

(17) Solder-resist layers (67F, 67S) (see FIG. 1) are formed on buildup insulation layers (51F, 51S) to form main rigid section (12A) having heat-dissipation member 75 either to the left or to the right of flexible section 11, and to form sub-rigid section (12B) on a side of flexible section 11 opposite main rigid section (12A). Openings (68F, 68S) are formed in solder-resist layers (67F, 67S) so that portions of outermost buildup conductive layers (53FA, 53SA) are exposed to work as first and second pads (41F, 41S) in main rigid section (12A) or mounting pads (43F, 43S) in sub-rigid section (12B) respectively. Accordingly, flex-rigid wiring board 10 is obtained as shown in FIG. 1.

So far, the structure of flex-rigid wiring board 10 of the present embodiment and its manufacturing method are described. The following are descriptions of the effects achieved by flex-rigid wiring board 10.

According to flex-rigid wiring board 10 of the present embodiment, heat dissipating capability is enhanced by heat-dissipation member 75. Since heat-dissipation member 75 forms part of non-flexible substrate 30 positioned on one side of flexible substrate 15, compared with a structure where portions of buildup insulation layers (51F, 51S) are made of heat-dissipation member 75, the space on a side of flexible section 11 is used effectively, thereby reducing the size of flex-rigid wiring board 10.

In flex-rigid wiring board 10 of the present embodiment, first pads (41F) formed on first surface (12AF) of main rigid section (12A) are connected to heat-dissipation member 75 by via conductors (54F). Thus, heat is dissipated from an electronic component (active component 90) mounted on first pads (41F). Moreover, since heat-dissipation member 75 and first pads (41F) are connected by first stacked vias (47F) formed by laminating multiple first via conductors (54F) in a straight line, the route from first pads (41F) to heat-dissipation member 75 is shortened, and the heat dissipating capability is thereby enhanced. In addition, since the end surface of heat-dissipation member 75 is exposed to the outside, the heat dissipating capability is further enhanced.

In the present embodiment, since second pads (41S) formed on second surface (12AS) of main rigid section (12A) are also connected to heat-dissipation member 75 by via conductors (54S), heat is dissipated from an electronic component (passive component 91) mounted on second pads. Moreover, heat-dissipation member 75 and second pads (41S) are connected by second stacked vias (47S) formed by laminating multiple first via conductors (54S) in a straight line. Accordingly, the route from second pads (41S) to heat-dissipation member 75 is shortened, thus enhancing its heat dissipating capability.

Second Embodiment

Figure 14:
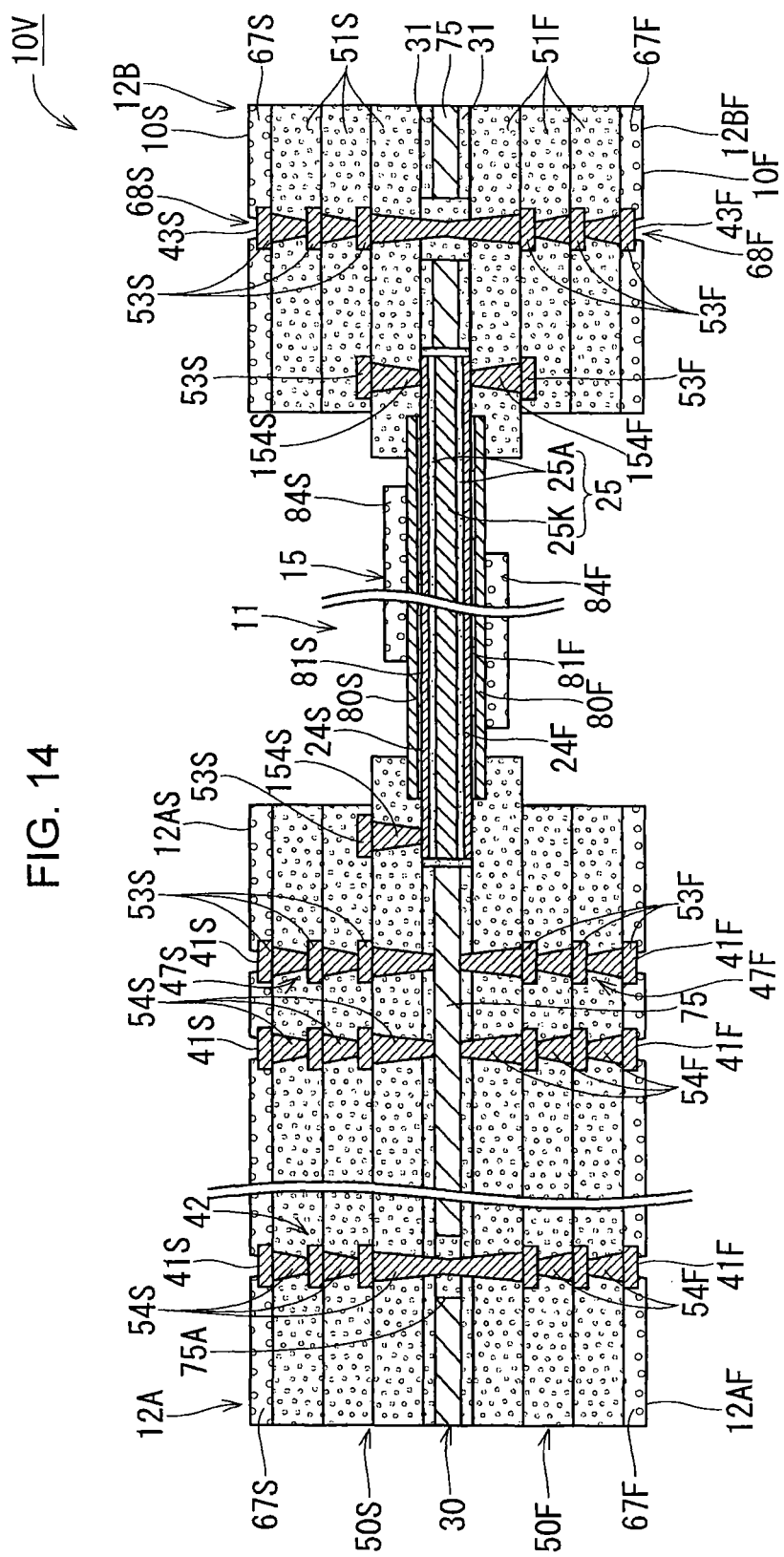
FIG. 14 shows a cross-sectional view of a flex-rigid wiring board according to a second embodiment of the present invention.

A second embodiment of the present invention is described with reference to FIG. 14~17. As shown in FIG. 14, flex-rigid wiring board (10V) of the present embodiment is different from the first embodiment in that the central portion of non-flexible substrate 30 in a thickness direction, namely, the entire core portion, is formed with heat-dissipation member 75.

Non-flexible substrate 30 is structured to have non-flexible intermediate substrate 31 laminated on upper and lower surfaces of sheet-type heat-dissipation member 75. Via insertion holes (75A) penetrating through heat-dissipation member 75 are filled with resin for forming non-flexible intermediate substrate 31. Each side surface of heat-dissipation member 75 makes part of the outer side surface of non-flexible substrate 30 and is exposed to the outside. Heat-dissipation member 75 is made of a graphite sheet, for example.

The same as in the first embodiment, first pads (41F) are connected to heat-dissipation member 75 by first stacked vias (47F), and second pads (41S) are connected to heat-dissipation member 75 by second stacked vias (47S). First and second pads (41F, 41S) are connected by all-layer stacked vias 42 that penetrate through via insertion holes (75A).

In flex-rigid wiring board (10V) of the present embodiment, first and second wiring layers (24F, 24S) are positioned only on flexible intermediate substrate 25, while innermost buildup conductive layers (53F, 53S) are positioned to overlap flexible intermediate substrate 25. Buildup conductive layers (53F, 53S) and first and second wiring layers (24F, 24S) are connected by via conductors (154F, 154S) penetrating though innermost buildup insulation layers (51F, 51S). In the present embodiment, non-flexible substrate 30 is set to have substantially the same thickness as that of flexible intermediate substrate 25.

The rest of the structure of flex-rigid wiring board (10V) is the same as that in flex-rigid wiring board 10 of the first embodiment. Thus, the same reference numerals are assigned to those same portions and their redundant descriptions are omitted here.

Manufacturing of Flex-Rigid Wiring Board (1) Sheet-type heat-dissipation member 75 is prepared as shown in FIG. 15A.

(2) As shown in FIG. 15B, via insertion holes (75A) are formed in heat-dissipation member 75 through drilling or the like.

(3) As shown in FIG. 15C, non-flexible intermediate substrate 31 is laminated and pressed on upper and lower surfaces of heat-dissipation member 75 to form non-flexible substrate 30. At that time, via insertion holes (75A) are filled with resin for forming non-flexible intermediate substrate 31.

(4) As shown in FIG. 16A, opening (30A) is formed in non-flexible substrate 30, and flexible substrate 15 is prepared. By taking the same procedures described above in (1)~(11) of the first embodiment, flexible substrate 15 is formed by laminating first wiring layer (24F), adhesive layer (81F), coverlay (80F) and solder-resist layer (84F) on first surface (25F) of flexible intermediate substrate 25, while laminating second wiring layer (24S), adhesive layer (81S), coverlay (80S) and solder-resist layer (84S) on second surface (25S).

(5) As shown in FIG. 16B, flexible substrate 15 is accommodated in opening (30A) of non-flexible substrate 30. At that time, a slight gap is formed between the edges of opening (30A) and flexible substrate 15. Then, buildup insulation layers (51F, 51S) are formed on upper and lower surfaces of non-flexible substrate 30 in such a way as to laminate buildup insulation layers (51F, 51S) on both end portions of flexible substrate 15 but to expose the center portion of flexible substrate 15.

(6) Release layers (86F, 86S) are laminated on the exposed portion of flexible substrate 15. Next, copper foil (52F) is laminated on buildup insulation layer (51F) and release layer (86F), while copper foil (52S) is laminated on buildup insulation layer (51S) and release layer (86S). Then, the copper foils are pressed (see FIG. 17A). During that time, the gap between flexible substrate 15 (flexible intermediate substrate 25) and the edges of opening (30A) of non-flexible substrate 30 is filled with resin for forming non-flexible intermediate substrate 31 or for forming buildup insulation layers (51F, 51S).

(7) By using a laser, openings are formed in buildup insulation layers (51F, 51S). Then, by performing electroless plating, plating resist and electrolytic plating procedures, via conductors (54F, 54S, 154F, 154S) are formed in the openings, while buildup conductive layers (53F, 53S) are formed on buildup insulation layers (51F, 51S) (see FIG. 17B). Via conductors (54F, 54S) penetrate through via insertion holes (75A) of heat-dissipation member 75 to be integrated with each other. Also, release conductors (61F, 61S) are formed on release layers (86F, 86S) in such a way to expose copper foils (62F, 62S) on the end portions.

(8) Next, by taking the same procedures described above in (14)~(17) of the first embodiment, flex-rigid wiring board (10V) is completed.

The structure of flex-rigid wiring board (10V) of the present embodiment and its manufacturing method are described above. Flex-rigid wiring board (10V) of the present embodiment exhibits the same effects as achieved in flex-rigid wiring board 10 of the first embodiment. In flex-rigid wiring board (10V) of the present embodiment, heat-dissipation member 75 is positioned to cover the entire plane of non-flexible substrate 30. Accordingly, the degree of heat dissipation is enhanced.

Other Embodiments

The present invention is not limited to the embodiments described above. For example, the embodiments described below are also included in the technological scope of the present invention. Moreover, any other modification is possible to carry out the present invention as long as it does not deviate from the gist of the present invention.

Figure 18:
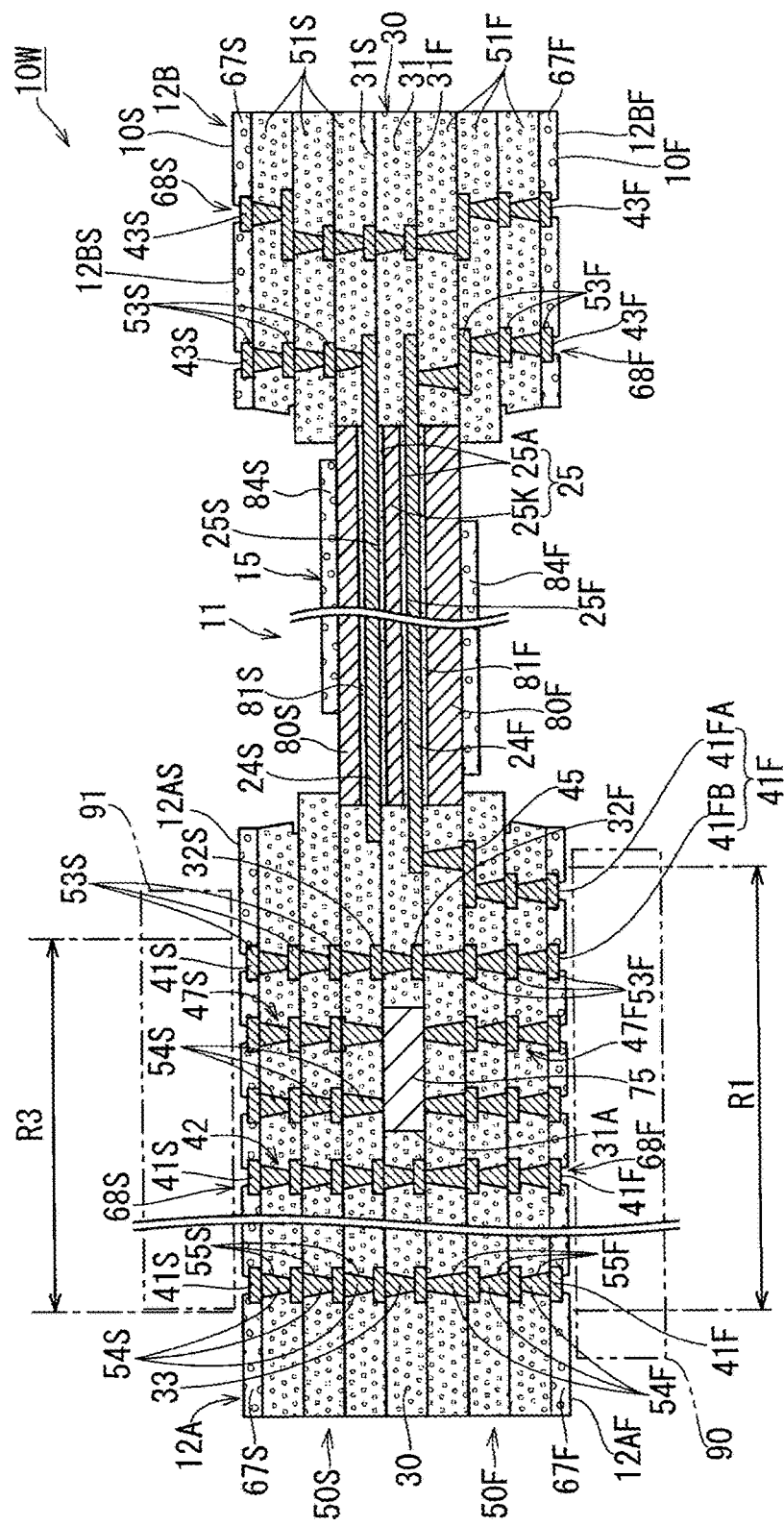
FIG. 18 shows a step for manufacturing a flex-rigid wiring board according to a modified example.

(1) In the first embodiment, heat-dissipation member 75 is positioned on an end portion of non-flexible substrate 30 and a side surface of heat-dissipation member 75 is exposed to the outside. However, as in flex-rigid wiring board (10W) shown in FIG. 18, a side surface of heat-dissipation member 75 may be embedded in non-flexible substrate 30 so as not to expose the side surface to the outside.

Figure 19:
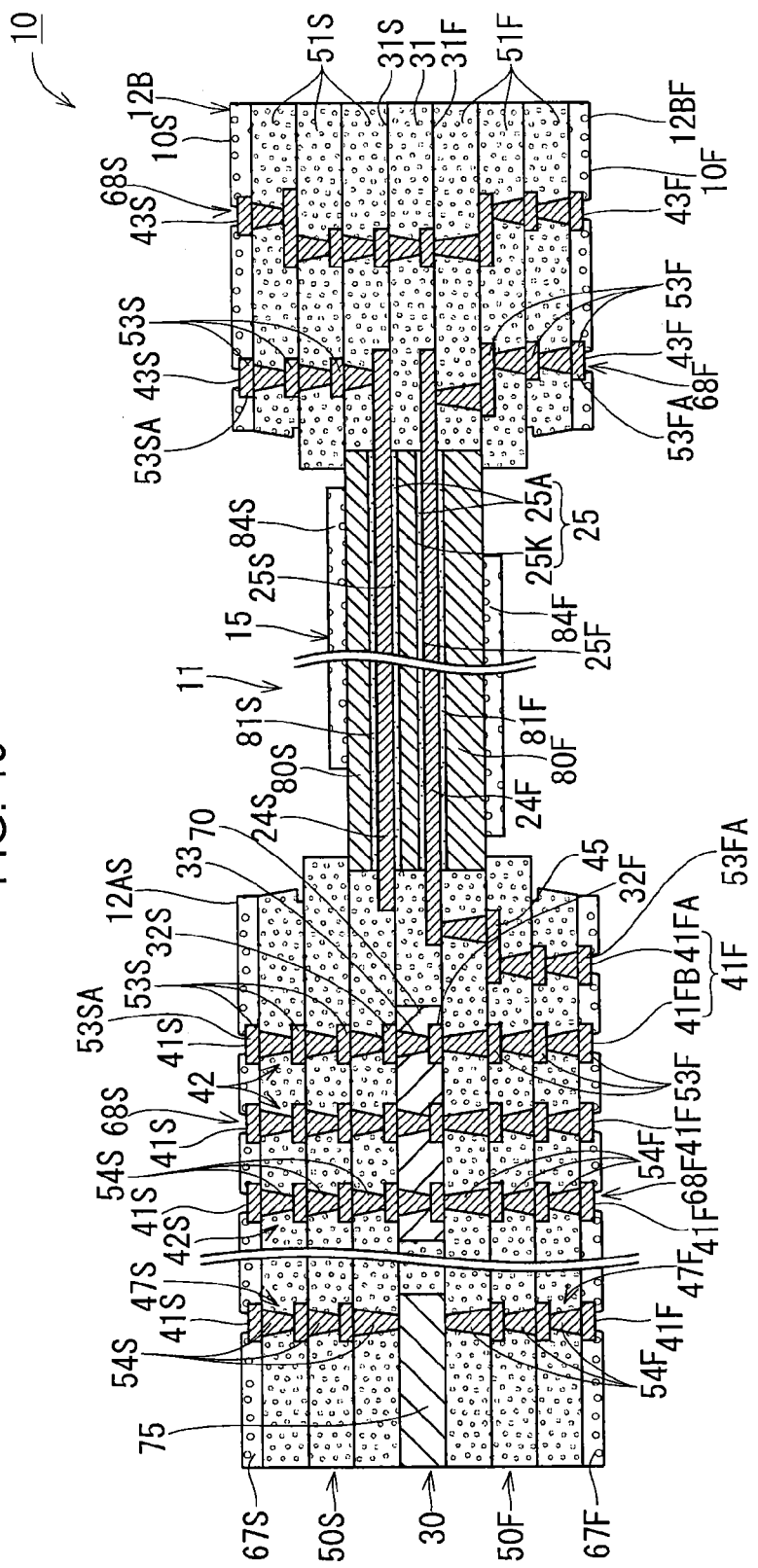
FIG. 19 shows a cross-sectional view of a flex-rigid wiring board according to another modified example.

(2) In the first embodiment, non-flexible substrate 30 is made up of non-flexible intermediate substrate 31 and heat-dissipation substrate 75. However, as shown in FIG. 19, the portion of non-flexible substrate 30, through which all-layer stacked vias 42 penetrate, may be made of substrate 70 using a material having a lower coefficient of thermal expansion than that of buildup insulation layer 51. According to such a structure, the space on a side of flexible section 11 is used effectively while stress exerted on all-layer stacked vias 42 is mitigated.

Figure 20:
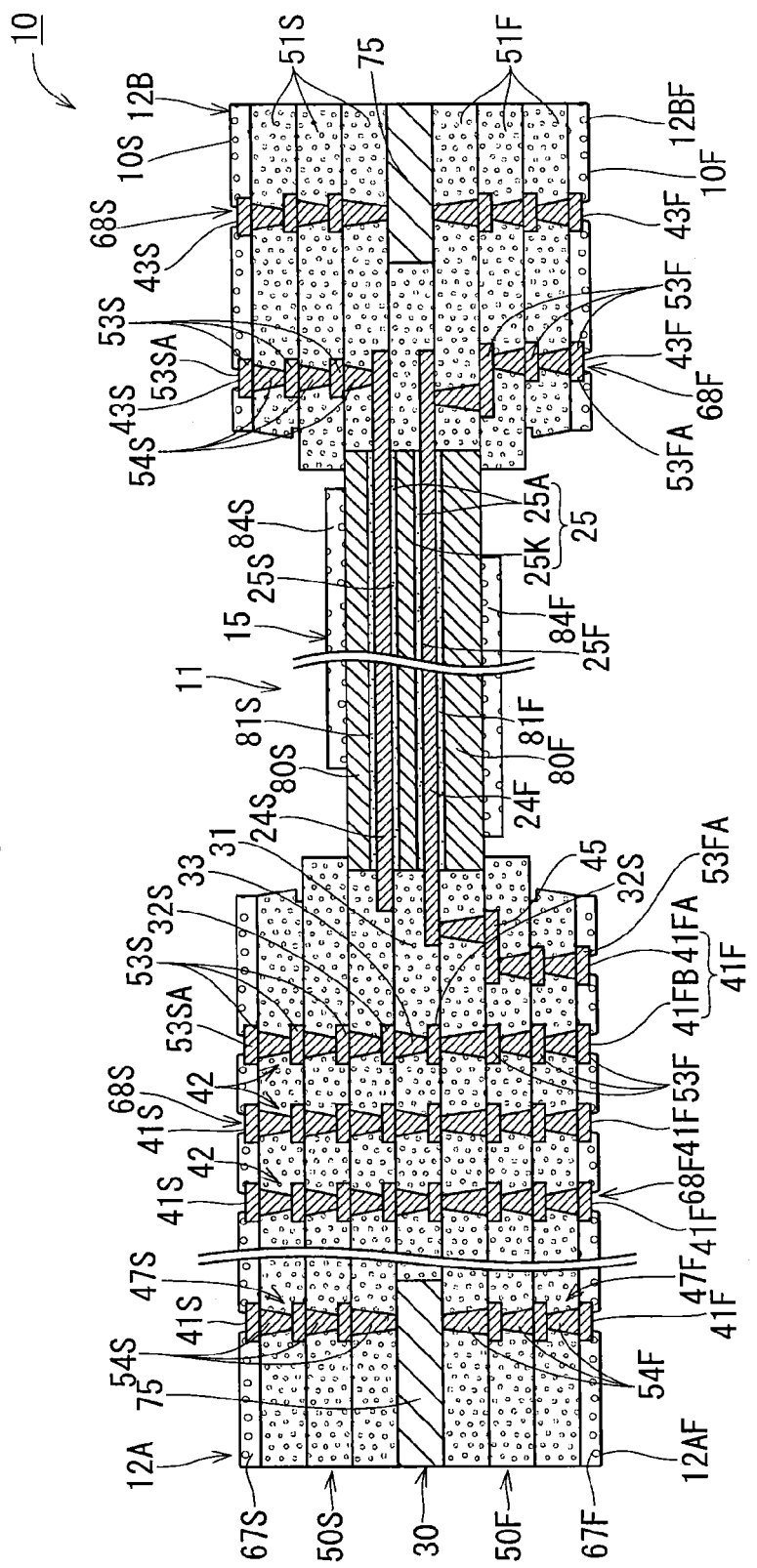
FIG. 20 shows a cross-sectional view of a flex-rigid wiring board according to yet another modified example.

(3) Part of or the entire non-flexible substrate 30 in sub-rigid section (12B) in the first embodiment may also be formed with heat-dissipation member 75 as shown in FIG. 20. In the example shown in FIG. 20, part of non-flexible substrate 30 is formed with heat-dissipation substrate 75.

Figure 21:
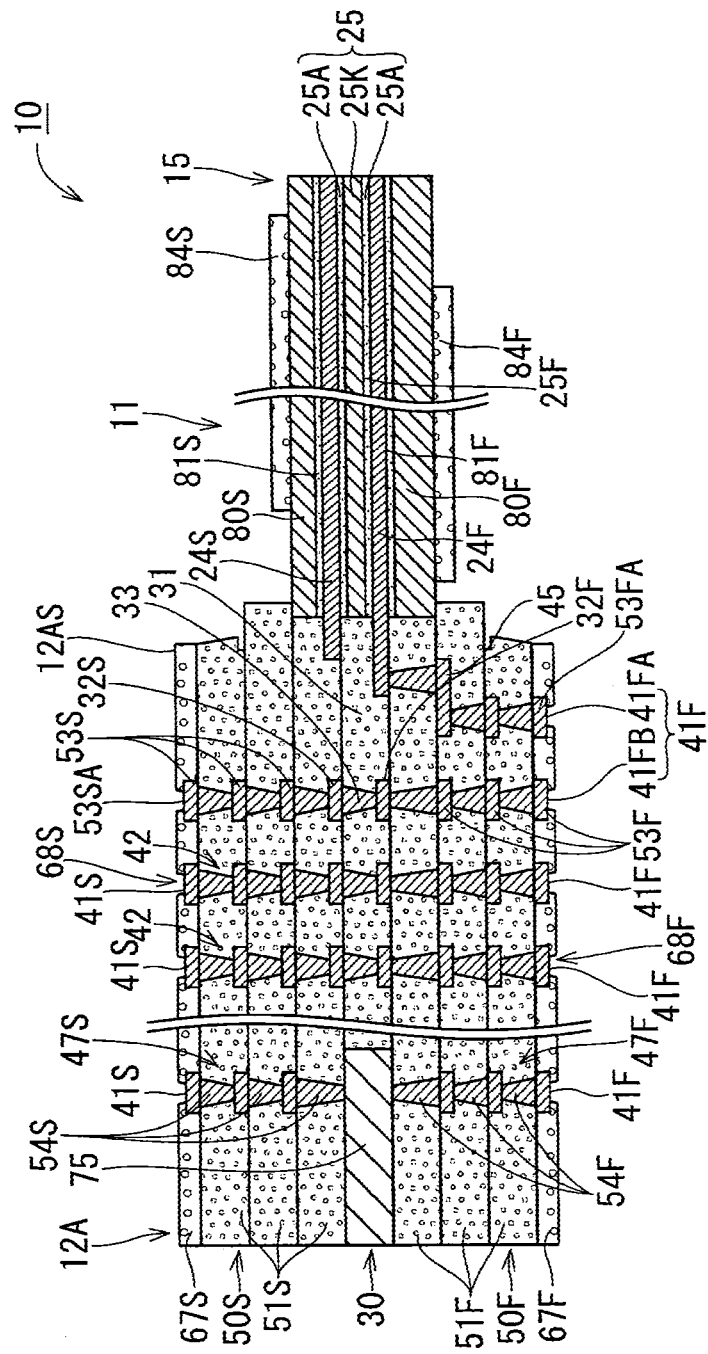
FIG. 21 shows a cross-sectional view of a flex-rigid wiring board according to yet another modified example.

(4) In the first embodiment, flex-rigid wiring board 10 is provided with two rigid sections (main rigid section (12A) and sub-rigid section (12B)). However, flex-rigid wiring board 10 may be structured to have only one rigid section, in particular, only main rigid section (12A) in the above embodiment (see FIG. 21).

Figure 22:
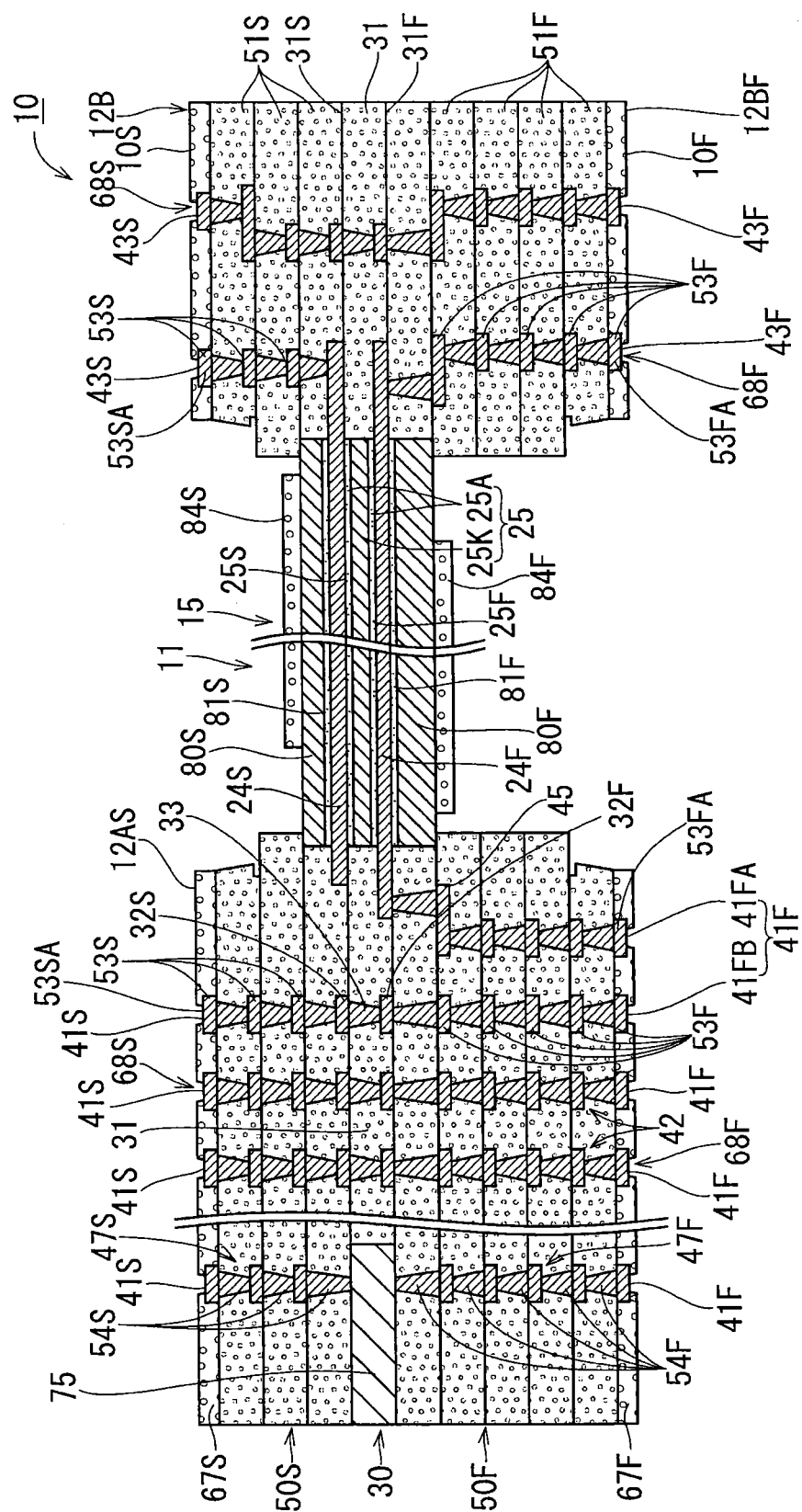
FIG. 22 shows a cross-sectional view of a flex-rigid wiring board according to yet another modified example.

(5) In the first embodiment, as shown in FIG. 22, flex-rigid wiring board 10 may be structured to have a different number of buildup insulation layers (51F) laminated on the first-surface (30F) side of non-flexible substrate 30 from the number of buildup insulation layers (51S) laminated on the second-surface (30S) side.

Figure 23:
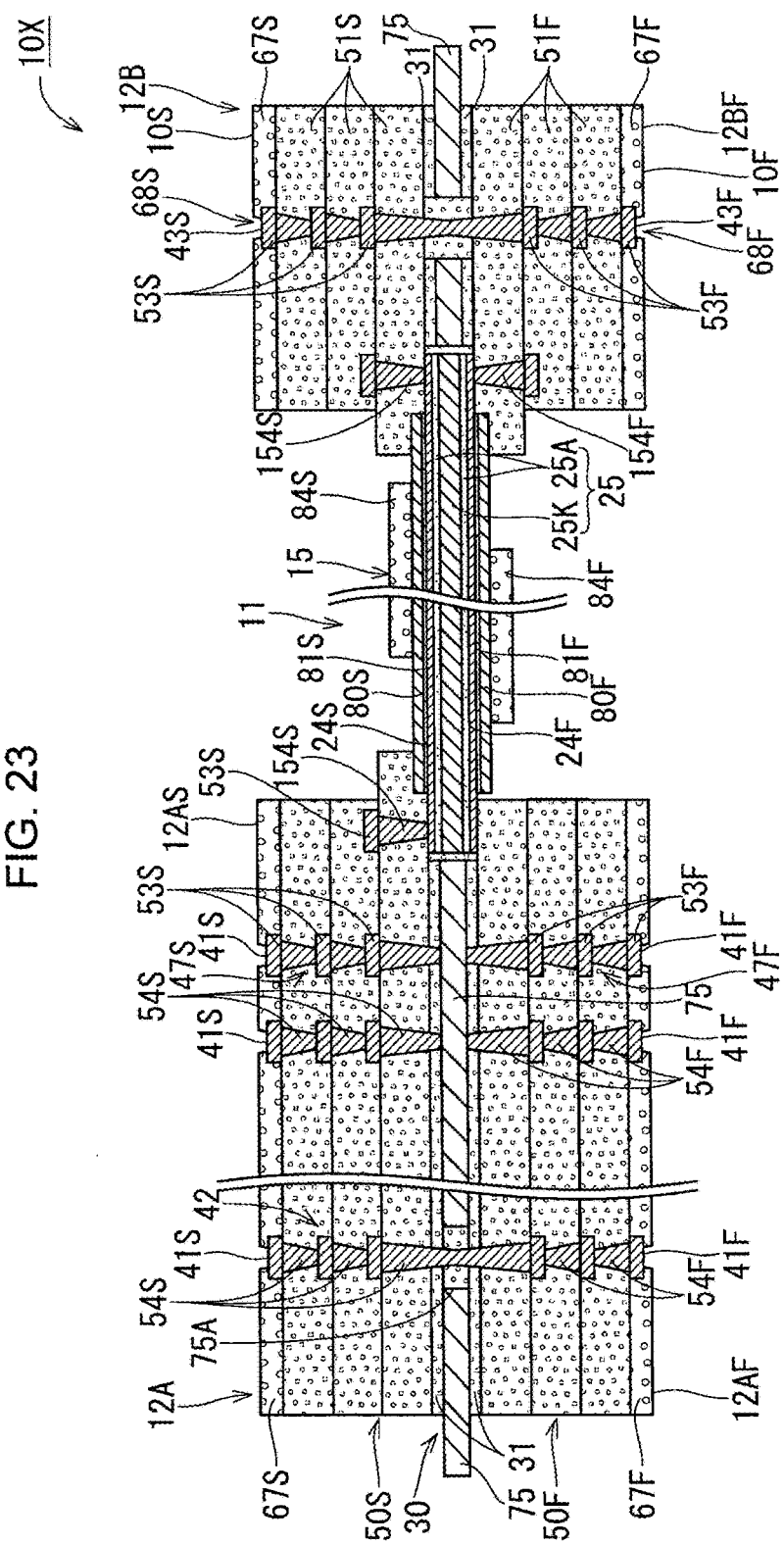
FIG. 23 shows a cross-sectional view of a flex-rigid wiring board according to yet another modified example.

(6) In the second embodiment, heat-dissipation member 75 may be set to protrude outward from a side surface of non-flexible intermediate substrate 31, as shown in FIG. 23. Yet alternatively, such a structure may be applied to the structure described in (3) above.

Figure 24:
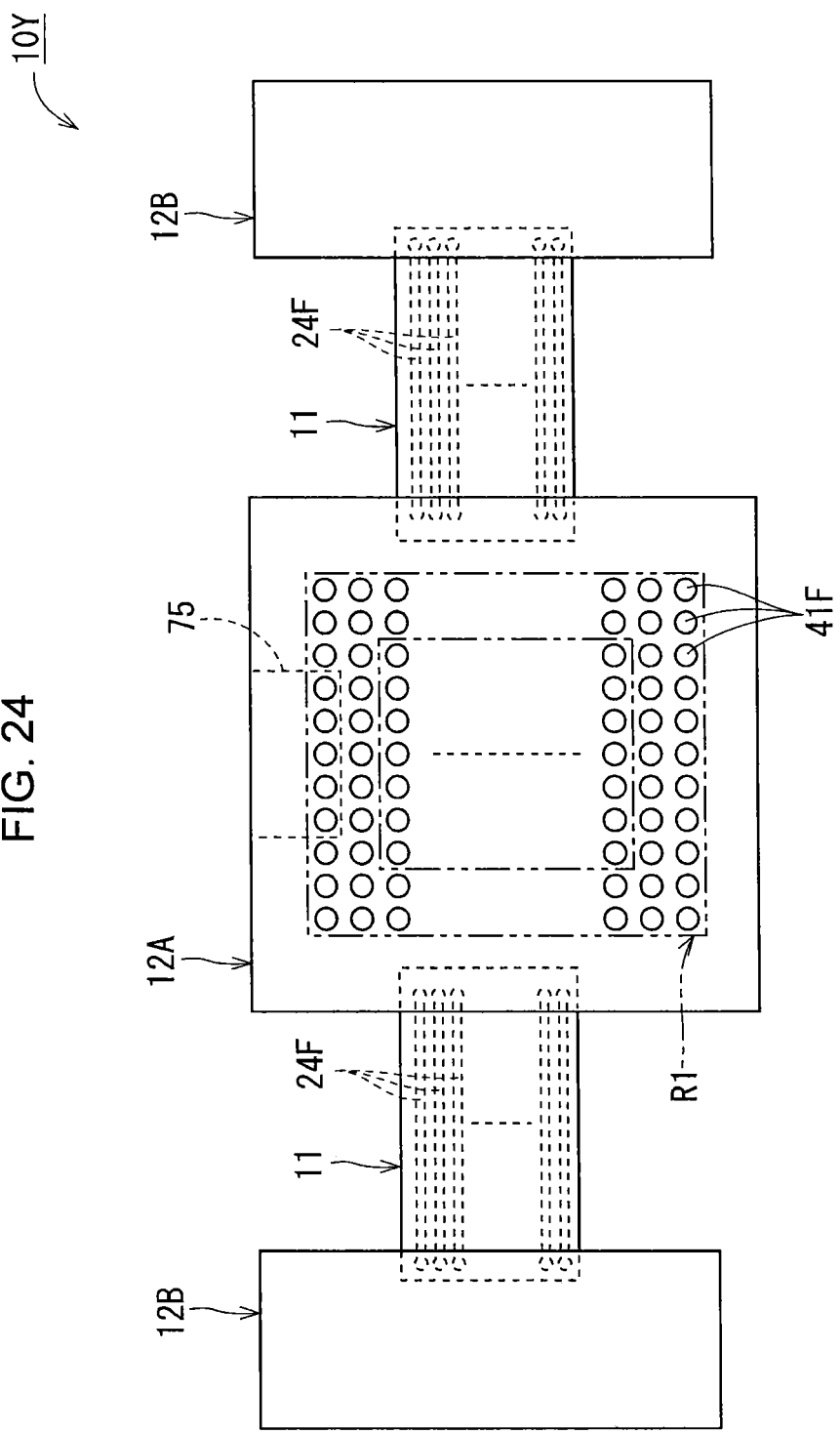
FIG. 24 shows a plan view of a flex-rigid wiring board according to yet another modified example.

(7) In the embodiments above, flex-rigid wiring board 10 is structured to have one flexible section 11 and one sub-rigid section (12B) on either side of main rigid section (12A). However, as in flex-rigid wiring board (10X) shown in FIG. 24, main rigid section (12A) may have multiple flexible sections 11 and multiple rigid sections (12B) (in the example shown in FIG. 24, two each flexible sections 11 and sub-rigid sections (12B) are provided).

A flex-rigid wiring board may have low heat dissipating capability. A flex-rigid wiring board according to an embodiment of the present invention exhibits enhanced heat dissipating capability.

A flex-rigid wiring board according to an embodiment of the present invention is structured to have a flexible section and a non-flexible rigid section positioned to be connected on a side of the flexible section. Such a flex-rigid wiring board is made up of a flexible substrate, a non-flexible substrate positioned on a side of the flexible substrate, and insulation layers laminated on upper and lower surfaces of the flexible substrate and on the non-flexible substrate so as to form the rigid section while exposing part of the flexible substrate as the flexible section. Part of or the entire non-flexible substrate is made of a heat dissipating material having higher thermal conductivity than that of the insulation layers.

Obviously, numerous modifications and variations of the present invention are possible in light of the above teachings. It is therefore to be understood that within the scope of the appended claims, the invention may be practiced otherwise than as specifically described herein.

What is claimed is:

1. A flex-rigid wiring board, comprising:
   a flexible substrate;
   a first non-flexible substrate positioned on a first side of the flexible substrate;
   a second non-flexible substrate positioned on a second side of the flexible substrate;
   a first insulation layer laminated on first surfaces of the flexible substrate and first and second non-flexible substrates; and
   a second insulation layer laminated on second surfaces of the flexible substrate and first and second non-flexible substrates,
   wherein each of the first and second insulation layers has an opening portion exposing a portion of the flexible substrate such that the portion of the flexible substrate forms a flexible section connecting non-flexible rigid sections, and at least one of the first and second non-flexible substrates includes a non-flexible intermediate substrate and a heat dissipating portion comprising a heat dissipating material having thermal conductivity which is higher than thermal conductivity of the first and second insulation layers such that the heat dissipating portion is positioned in an opening portion formed in the non-flexible intermediate substrate.

2. A flex-rigid wiring board according to claim 1, wherein the heat dissipating portion has a sheet form forming a central portion of at least one of the first and second non-flexible substrates.

3. A flex-rigid wiring board according to claim 1, wherein the heat dissipating portion has a side surface exposed to outside.

4. A flex-rigid wiring board according to claim 1, wherein the heat dissipating portion has an end portion protruding from at least one of the first and second non-flexible substrates in a side direction.

5. A flex-rigid wiring board according to claim 1, wherein the heat dissipating portion has a block form, and one of the first and second non-flexible substrates has the heat dissipating portion.

6. A flex-rigid wiring board according to claim 1, wherein the heat dissipating material of the heat dissipating portion comprises a carbon material.

7. A flex-rigid wiring board according to claim 1, wherein the heat dissipating material of the heat dissipating portion comprises graphite.

8. A flex-rigid wiring board according to claim 1, wherein the heat dissipating material of the heat dissipating portion comprises a metal material.

9. A flex-rigid wiring board according to claim 1, wherein the heat dissipating material of the heat dissipating portion comprises copper.

10. A flex-rigid wiring board according to claim 1, further comprising:
    a plurality of first pads positioned to mount an electronic component; and
    a first via conductor connecting the heat dissipating portion and one of the first pads through the first insulation layer.

11. A flex-rigid wiring board according to claim 10, further comprising:
    a plurality of second pads positioned to mount a second electronic component; and
    a second via conductor connecting the heat dissipating portion and one of the second pads through the second insulation layer.

12. A flex-rigid wiring board according to claim 11, further comprising:
    an all-layer stack via conductor structure connecting one of the first pads and one of the second pads through the first and second insulation layers and one of the first and second non-flexible substrates such that the all-layer stack via conductor structure does not penetrate through the heat dissipating portion.

13. A flex-rigid wiring board according to claim 12, wherein the non-flexible rigid sections comprise a main non-flexible rigid section and a secondary non-flexible rigid section such that the plurality of first pads and the plurality of second pads are formed in the main non-flexible rigid section.

14. A flex-rigid wiring board according to claim 11, wherein the non-flexible rigid sections comprise a main non-flexible rigid section and a secondary non-flexible rigid section such that the plurality of first pads and the plurality of second pads are formed in the main non-flexible rigid section.

15. A flex-rigid wiring board according to claim 1, further comprising:
    a plurality of first pads positioned to mount an electronic component; and
    a plurality of first via conductors connecting the heat dissipating portion and one of the first pads,
    wherein the first insulation layer is formed in a plurality, and the plurality of first via conductors is formed in the plurality of first insulation layers respectively such that the first via conductors are stacked in a straight line through the first insulation layers.

16. A flex-rigid wiring board according to claim 15, further comprising:
    a plurality of second pads positioned to mount a second electronic component; and
    a plurality of second via conductors connecting the heat dissipating portion and one of the second pads, wherein the second insulation layer is formed in a plurality, and the plurality of second via conductors is formed in the plurality of second insulation layers respectively such that the second via conductors are stacked in a straight line through the second insulation layers.

17. A flex-rigid wiring board according to claim 16, further comprising:
an all-layer stack via conductor structure connecting one of the first pads and one of the second pads through the first and second insulation layers and one of the first and second non-flexible substrates such that the all-layer stack via conductor structure does not penetrate through the heat dissipating portion.

18. A flex-rigid wiring board according to claim 17, wherein the non-flexible rigid sections comprise a main non-flexible rigid section and a secondary non-flexible rigid section such that the plurality of first pads and the plurality of second pads are formed in the main non-flexible rigid section.

19. A flex-rigid wiring board according to claim 16, wherein the non-flexible rigid sections comprise a main non-flexible rigid section and a secondary non-flexible rigid section such that the plurality of first pads and the plurality of second pads are formed in the main non-flexible rigid section.

20. A flex-rigid wiring board according to claim 1, further comprising:
a plurality of first pads positioned to mount an electronic component on the first insulation layer; and
a plurality of second pads positioned to mount a second electronic component on the second insulation layer,
wherein the non-flexible rigid sections comprise a main non-flexible rigid section and a secondary non-flexible rigid section such that the plurality of first pads and the plurality of second pads are formed in the main non-flexible rigid section.

* * * * *